United States Patent
Zheng et al.

(10) Patent No.: US 11,169,438 B2
(45) Date of Patent: Nov. 9, 2021

(54) MASK, EXPOSURE METHOD AND TOUCH DISPLAY PANEL

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Qitao Zheng, Beijing (CN); Zouming Xu, Beijing (CN); Lei Zhang, Beijing (CN); Jian Tian, Beijing (CN); Guiyu Zhang, Beijing (CN); Chunjian Liu, Beijing (CN); Xintao Wu, Beijing (CN); Tong Chen, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 62 days.

(21) Appl. No.: 16/703,682

(22) Filed: Dec. 4, 2019

(65) Prior Publication Data
US 2020/0103750 A1 Apr. 2, 2020

Related U.S. Application Data

(63) Continuation-in-part of application No. PCT/CN2018/124326, filed on Dec. 27, 2018.

(30) Foreign Application Priority Data

Jun. 21, 2018 (CN) .......................... 201810642760.0

(51) Int. Cl.
*G03F 1/42* (2012.01)
*G03F 7/22* (2006.01)
(Continued)

(52) U.S. Cl.
CPC .................. *G03F 1/42* (2013.01); *G03F 7/22* (2013.01); *G03F 7/70475* (2013.01);
(Continued)

(58) Field of Classification Search
CPC ............... G03F 1/42; G03F 7/22; G06F 3/041
See application file for complete search history.

(56) References Cited

U.S. PATENT DOCUMENTS 9,519,167 B2 12/2016 Choi et al.
2011/0102370 A1* 5/2011 Kono ................. H03K 17/9622
345/174
(Continued)

FOREIGN PATENT DOCUMENTS

CN 102981356 A 3/2013
CN 104570611 A 4/2015
(Continued)

*Primary Examiner* — Kent W Chang
*Assistant Examiner* — Chayce R Bibbee
(74) *Attorney, Agent, or Firm* — Kinney & Lange, P.A.

(57) ABSTRACT

A mask is provided. The mask includes a plurality of light blocking strips configured to block light and bounding spaces through which light is allowed to pass. The plurality of light blocking strips are arranged in a mesh shape, and include first light blocking strips located in at least one side edge of the mask, and second light blocking strips, and each of the first light blocking strips has a greater width than each of the second light blocking strips. An exposure method using the mask, and a touch display panel manufactured by the exposure method are also provided.

19 Claims, 26 Drawing Sheets

(51) Int. Cl.
    *G03F 7/20*         (2006.01)
    *G06F 3/041*      (2006.01)

(52) U.S. Cl.
    CPC .... *G06F 3/041* (2013.01); *G06F 2203/04103* (2013.01); *G06F 2203/04112* (2013.01)

(56) References Cited

U.S. PATENT DOCUMENTS

| | | | |
|---|---|---|---|
| 2016/0085264 A1 | 3/2016 | Choi et al. | |
| 2016/0334674 A1* | 11/2016 | Yu | G03F 9/7084 |
| 2017/0329177 A1* | 11/2017 | Nakagawa | G02F 1/133516 |
| 2018/0095567 A1* | 4/2018 | Lee | G06F 3/03547 |
| 2020/0103750 A1 | 4/2020 | Zheng et al. | |

FOREIGN PATENT DOCUMENTS

| | | |
|---|---|---|
| CN | 106200254 A | 12/2016 |
| CN | 107219720 A | 9/2017 |
| CN | 108761995 A | 11/2018 |

* cited by examiner

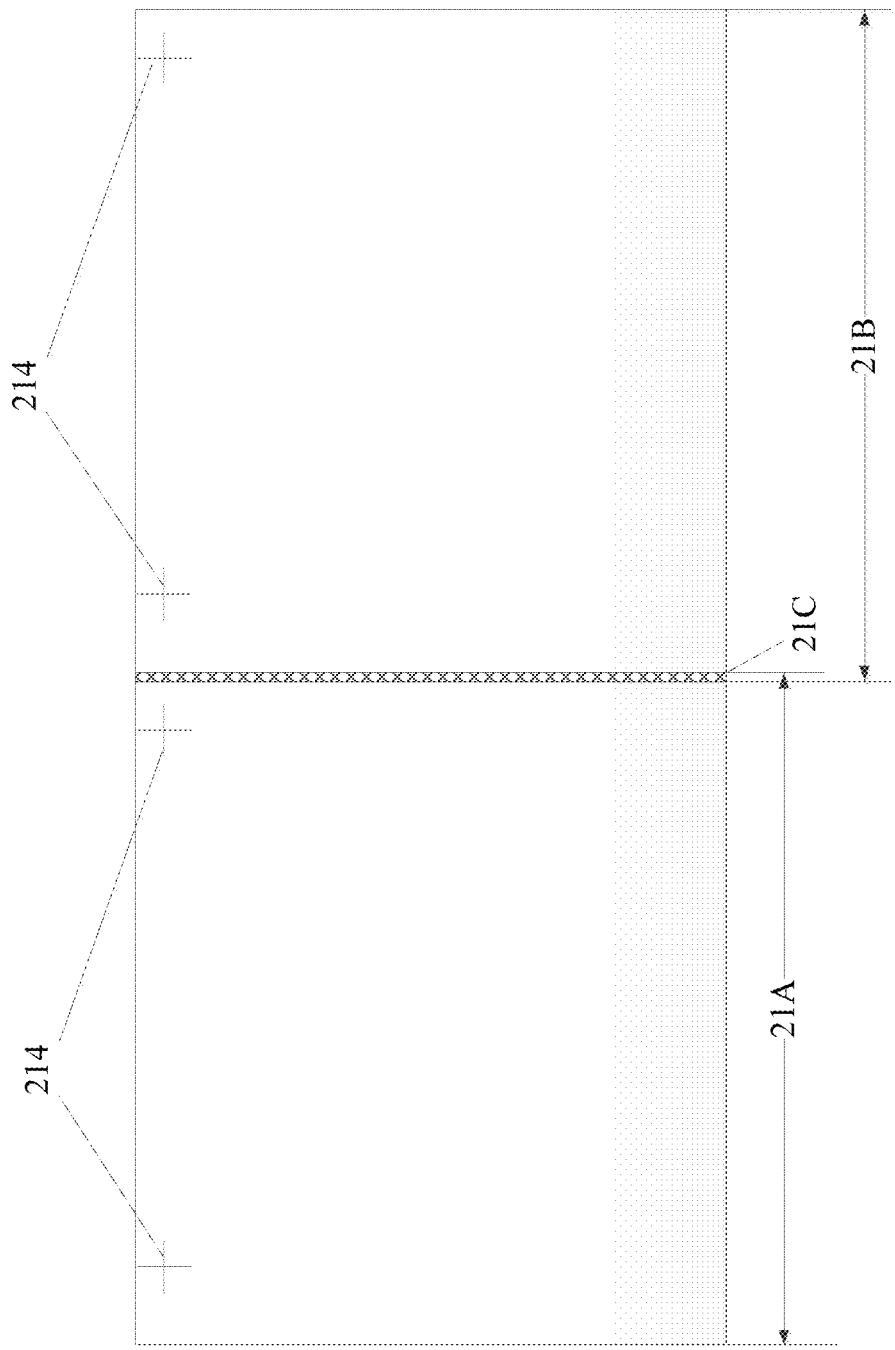

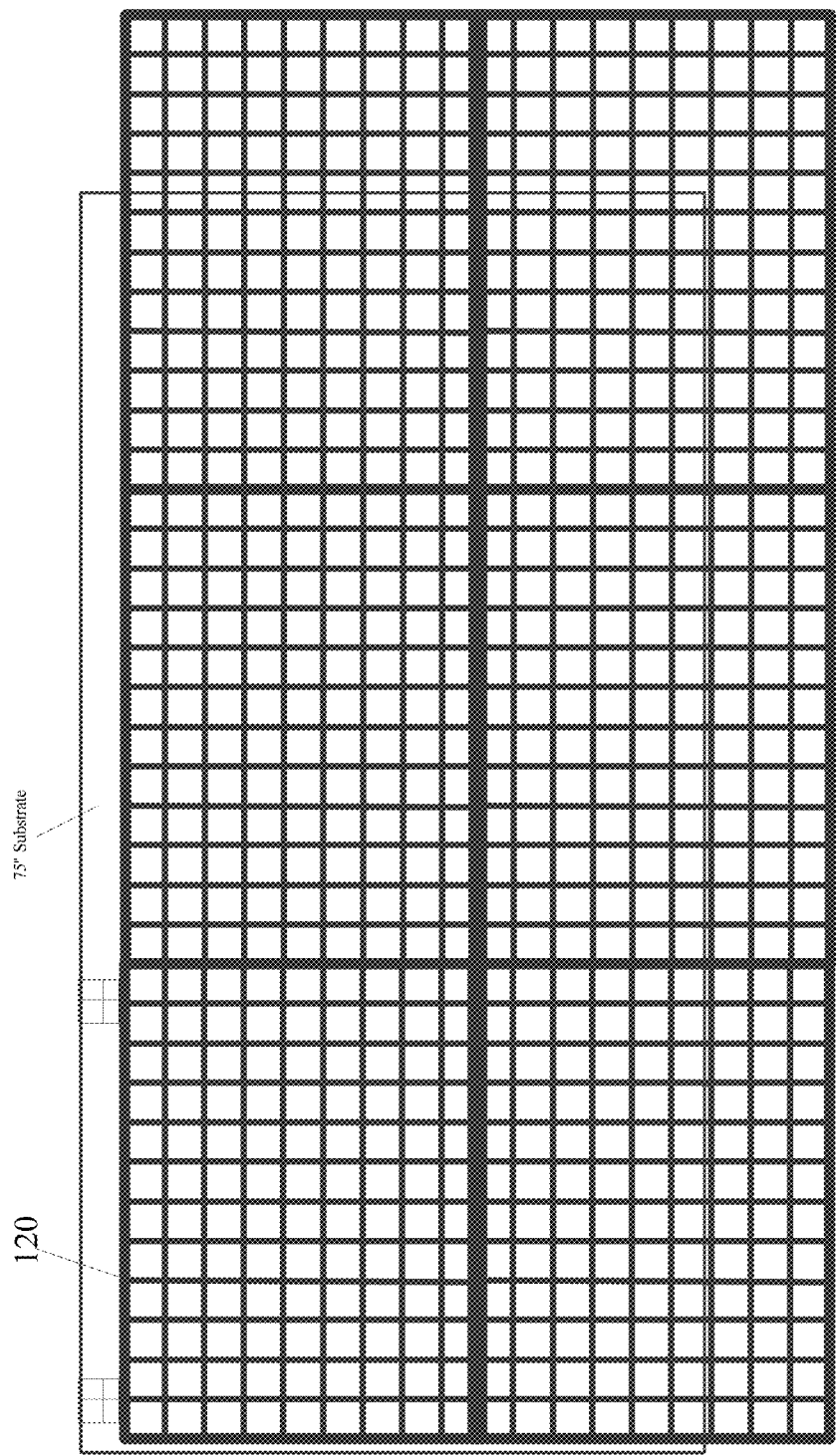

MASK, EXPOSURE METHOD AND TOUCH DISPLAY PANEL

CROSS-REFERENCE TO RELATED APPLICATION(S)

This application is a bypass continuation-in-part application of international Application No. PCT/CN2018/124326, filed on Dec. 27, 2018, entitled "MASK, EXPOSURE METHOD AND TOUCH DISPLAY PANEL," which claims priority to Chinese patent application No. 201810642760.0, filed on Jun. 21, 2018. The entire disclosures of the international application and the Chinese patent application are incorporated herein by reference in their entireties.

TECHNICAL FIELD

The present disclosure relates to a mask, an exposure method using the mask, and a touch display panel manufactured by the exposure method.

BACKGROUND

With a continual development of display technology, a size of a display panel or touch display panel continues to increase. In order to produce a larger-sized display panel or touch display panel, there is a need to produce a large-sized display panel or touch display panel by means of a low-generation production line.

SUMMARY

In an aspect, embodiments of the present disclosure provide a mask including: a plurality of light blocking strips configured to block a light and bounding spaces through which a light is allowed to pass, wherein the plurality of light blocking strips are arranged in a mesh shape, and include first light blocking strips located in at least one side edge of the mask, and second light blocking strips, and each of the first light blocking strips has a greater width than each of the second light blocking strips.

According to embodiments of the present disclosure, the mask is configured to be used in a splicing exposure process including at least two exposures, each of the first light blocking strips has a first width, each of the second light blocking strips has a second width, a difference between the first width and the second width is in direct proportion to a position deviation of the mask between the two exposures in the splicing exposure process.

According to embodiments of the present disclosure, first light blocking strips are located in two side edges of the mask in a splicing direction, or first light blocking strips are located in four side edges of the mask.

According to embodiments of the present disclosure, the width of each of the second light blocking strips is less than or equal to 6 μm.

According to embodiments of the present disclosure, a spacing between two adjacent ones of the second light blocking strips is in a range of 100-300 μm.

According to embodiments of the present disclosure, the mask further includes at least one alignment mark.

According to embodiments of the present disclosure, the first light blocking strips of the mask are configured to form a common pattern in a first exposure region and a second exposure region of a substrate which are adjacent to each other.

In another aspect, embodiments of the present disclosure provide an exposure method, the exposure method performs a splicing exposure process on a substrate including a first exposure region and a second exposure region by means of the above mask, the exposure method including steps of:

aligning the mask with the first exposure region of the substrate to perform a first exposure;

moving the mask relative to the substrate; and aligning the mask with the second exposure region of the substrate to perform a second exposure.

According to embodiments of the present disclosure, performing the first exposure includes:

forming a first pattern in the first exposure region by means of the first light blocking strips of the mask; and forming a second pattern in the first exposure region by means of the second light blocking strips of the mask, wherein the first pattern has a greater line width than the second pattern.

According to embodiments of the present disclosure, in the second exposure, an orthogonal projection of the first light blocking strips of the mask on the substrate partially overlaps an orthogonal projection of the first pattern on the substrate, and an overlap between the orthogonal projection of the first light blocking strips on the substrate and the orthogonal projection of the first pattern on the substrate has a width equal to the width of each of the second light blocking strips.

According to embodiments of the present disclosure, aligning the mask with the first exposure region of the substrate to perform the first exposure includes:

disposing a first alignment mark on the mask;

disposing a second alignment mark on the substrate; and aligning the first alignment mark with the second alignment mark so that the mask is aligned with the first exposure region of the substrate.

According to embodiments of the present disclosure, aligning the mask with the second exposure region of the substrate to perform the second exposure includes:

disposing a third alignment mark on the substrate; and aligning the first alignment mark with the third alignment mark so that the mask is aligned with the second exposure region of the substrate.

According to embodiments of the present disclosure, the substrate has long and short sides, and the mask has a maximum alignment distance that is a maximum one of distances between a position of the mask where the first alignment mark is capable of being disposed and the long and short sides of the mask, the exposure method further including:

comparing the short side of the substrate with the maximum alignment distance; and when the maximum alignment distance is greater than a length of the short side and a difference between the maximum alignment distance and the length of the short side is greater than a first threshold, the first exposure and the second exposure are performed only in a long side direction of the substrate.

According to embodiments of the present disclosure, the first exposure region and the second exposure region are contiguous to each other, and have the first pattern common to them.

According to embodiments of the present disclosure, aligning the mask with the second exposure region of the substrate to perform the second exposure includes:

aligning the first light blocking strips with the first pattern.

According to embodiments of the present disclosure, after the second exposure, a difference between the line width of the first pattern and the line width of the second pattern is less than a second threshold.

In a further aspect, embodiments of the present disclosure provide a touch display panel including:

a substrate;

a touch drive electrode disposed on the substrate; and a touch sense electrode disposed on the substrate, wherein the touch drive electrode and/or the touch sense electrode have/has a metal mesh structure, and are/is manufactured by the above exposure method.

According to embodiments of the present disclosure, the metal mesh structure includes a plurality of metal lines which are arranged in a mesh and each of which has a line width less than or equal to 5 μm, and a spacing between every two adjacent ones of the plurality of metal lines is in a range of 150-250 μm.

BRIEF DESCRIPTION OF THE DRAWINGS

Other objects and advantages of the present disclosure will become more apparent and a comprehensive understanding of the present disclosure can be facilitated by means of a description of the present disclosure with reference to the drawings as below.

FIG. 4 is a schematic top view of a substrate of a touch display panel according to an embodiment of the present disclosure;

FIG. 14 schematically shows a process of performing a splicing exposure process on a 75" substrate using the mask shown in FIG. 12;

It should be noted that the drawings are not necessarily plotted to scale, but are only schematically shown without an adverse influence on a reader in understanding.

DETAILED DESCRIPTION

In order that objects, technical solutions, and advantages of the present disclosure become more apparent, a clear and complete description of the technical solutions of the present disclosure will be made as below in conjunction with the accompanying drawings of the embodiments of the present disclosure. Apparently, the described embodiments are some of the embodiments of the present disclosure rather than all of the embodiments of the present disclosure. All other embodiments derived by those skilled in the art based on the following embodiments of the present disclosure without making a creative work shall fall within the protection scope of the present disclosure.

In order to produce a large-sized display panel or touch display panel, for example, a size of a mask also needs to be increased accordingly. At present, an exposure machine imposes a restriction on the size of the mask, and a large-sized mask has disadvantages such as difficulty in manufacturing, high cost, and inconvenience in routine storage and use. Therefore, when the large-sized display panel or touch display panel is manufactured, generally a large-sized substrate needs to be divided into a plurality of regions, and the regions are sequentially exposed with a mask, thereby forming the large-sized display panel or touch display panel. This process is referred as to a splicing exposure process. For example, taking a G6 production line of the BOE touch display panel factory as an example, a mask has an effective exposure area of 1100 mm×752 mm, a large-sized touch display panel has overall dimensions that exceed the effective exposure area of the mask. For example, a 65" touch display panel has overall dimensions of 1460 mm×831 mm, and a 75" touch display panel has overall dimensions of 1687 mm×957 mm. Therefore, only if a plurality of exposures, i.e. the splicing exposure process, needs to be performed, a desired pattern can be formed.

Figure 1:
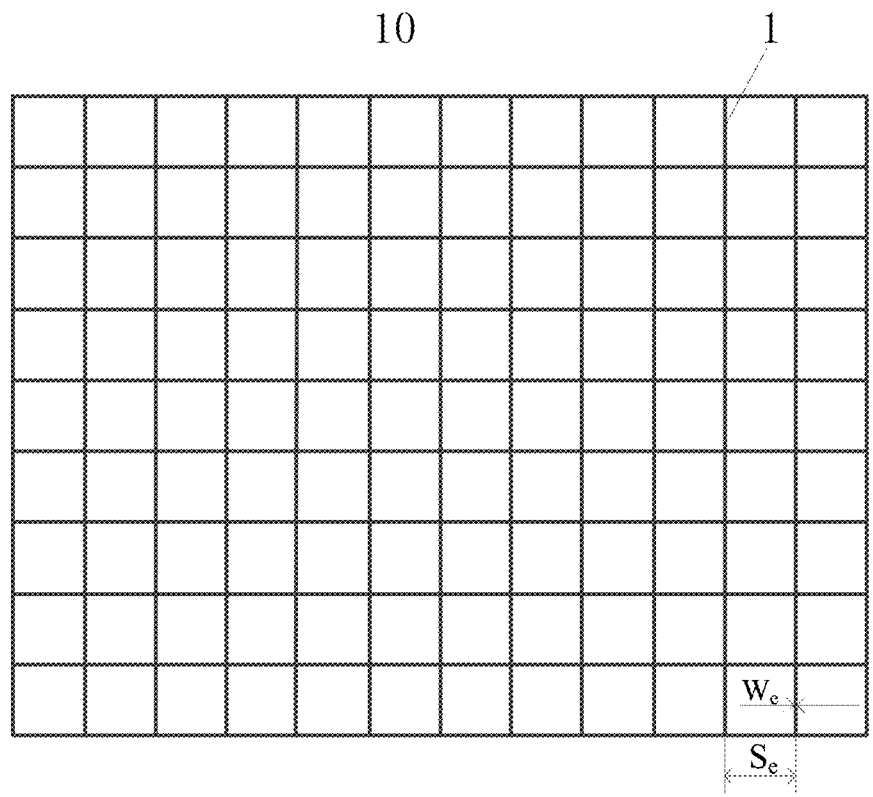
FIG. 1 schematically shows a structure of a metal mesh electrode.

FIG. 1 schematically shows a structure of a metal mesh electrode. With a rapid development of a touch display panel industry, a demand for transparent conductors such as indium tin oxide (ITO) has also increased greatly. However, disadvantages of ITO such as high price, low efficiency, fragility and low conductivity, have forced researchers to constantly try to find an electrode material or an electrode structure that can substitute for ITO. A metal mesh electrode is electrode structure that can substitute for ITO. As shown in FIG. 1, the metal mesh 10 includes a plurality of metal lines 1 which are arranged in a mesh shape. Each metal line 1 has a width $W_e$ greater than zero, and there is a space $S_e$ between every two adjacent metal lines 1. When the metal mesh electrode is used as a touch electrode of the touch display panel, the metal line has a very low resistance, and most of an area of the metal mesh (i.e. an area where the space is located) does not have any light blocking object so that a light can completely pass through the metal mesh electrode, thereby increasing a transmittance.

Figure 2:
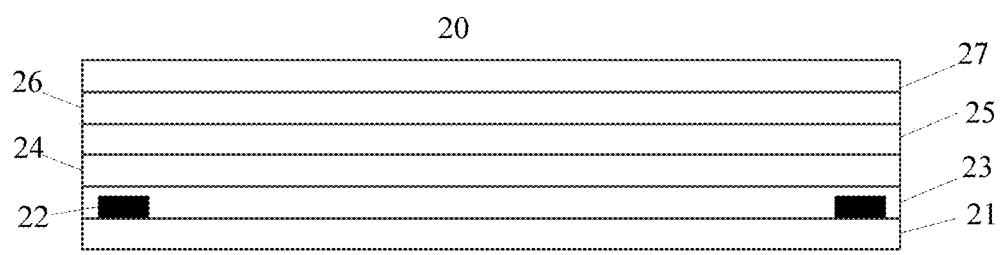
FIG. 2 is a schematic view showing a structure of a touch display panel according to an embodiment of the present disclosure.

The metal mesh electrode can be applied in the large-sized touch display panel to be used as at least one of a touch drive electrode and a touch sense electrode. Taking an one-glass solution (OGS) touch display panel as an example, as shown in FIG. 2, the touch display panel 20 may include: a substrate 21; a black matrix 22 disposed on the substrate 21; a first covering layer (overcoat (OC)) 23 disposed on the substrate 21 and covering the black matrix 22; a touch sense electrode 24 disposed on the first covering layer 23; a second covering layer 25 disposed on the touch sense electrode 24; a touch drive electrode 26 disposed on the second covering layer 25; and a third covering layer 27 disposed on the touch drive electrode 26. At least one of the touch sense electrode 24 and the touch drive electrode 26 may include the metal mesh structure shown in FIG. 1.

It should be noted that herein the covering layer is a layer for the purpose of insulating or protecting, and is generally a transparent optical material layer.

A patterning process may be used in order to form the touch sense electrode 24 or the touch drive electrode 26 on the substrate 21. For example, the patterning process may include steps such as an evaporation of a metal, an application of a photoresist, an exposure using a mask, a development, and an etch.

In embodiments of the present disclosure, the substrate 21 may be a large-sized substrate, for example a 65" substrate having overall dimensions of 1460 mm×831 mm or for example a 75" substrate having overall dimensions of 1687 mm×957 mm. The splicing exposure process needs to be performed in an exposure step in order to form the touch sense electrode 24 or the touch drive electrode 26 on the large-sized substrate 21.

The splicing exposure process will be described in more detail as below by taking a splicing exposure process including two exposures as an example. It should be appreciated by those skilled in the art that the splicing exposure process in the embodiments of the present disclosure is not limited to the splicing exposure process including two exposures, and may include more exposures such as three exposures, four exposures, six exposures, or the like.

Figure 3:
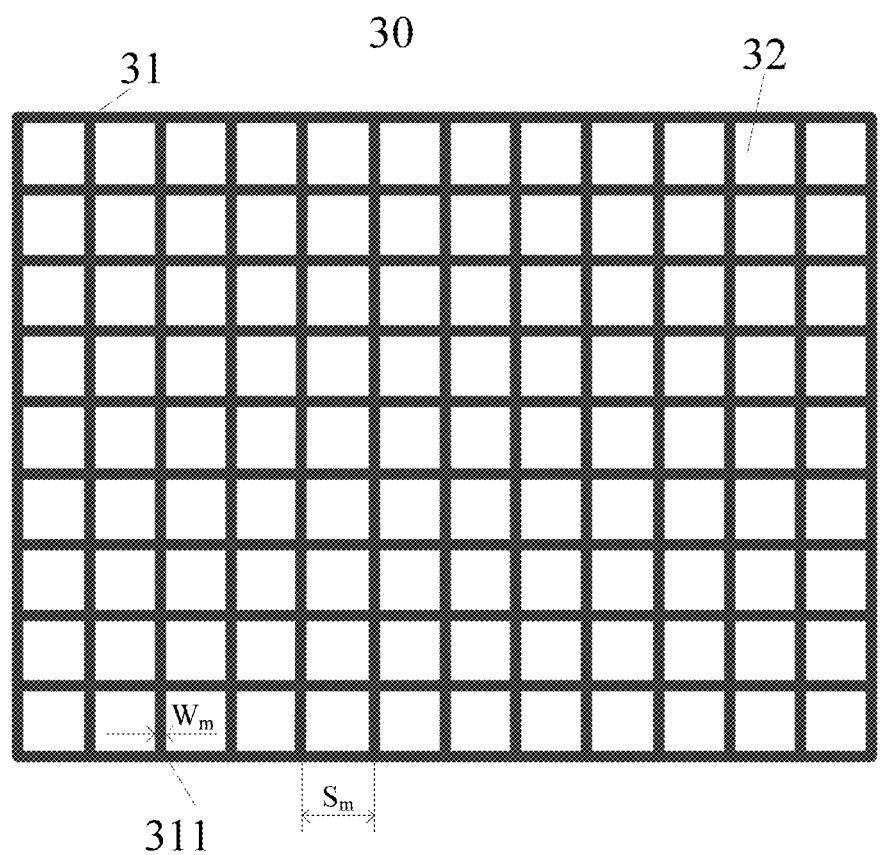
FIG. 3 is a schematic view showing a structure of a mask according to an embodiment of the present disclosure.

In order to form, on the substrate 21, the touch sense electrode 24 or the touch drive electrode 26 having the metal mesh structure shown in FIG. 1, a mask corresponding to the metal mesh structure needs to be used in the exposure step. FIG. 3 shows a mask according to an embodiment of the present disclosure. As shown in FIG. 3, the mask 30 includes a light blocking part 31 and a light transmitting part 32. The light blocking part 31 includes a plurality of light blocking strips 311 which are arranged in a mesh shape and each of which has a width $W_m$. The light transmitting part 32 is formed by the spaces bounded by the plurality of light blocking strips 311. There is a spacing $S_m$ between every two adjacent light blocking strips 311. In an example, the light blocking strip 311 may be made of an opaque material (such as a metal). When an exposure is performed by means of the mask 30, a light can pass through the light transmitting part 32 but is blocked by the light blocking part 31, so that a pattern corresponding to the mask 30 is formed on the substrate.

The substrate 21 is divided into two regions, i.e. a first region 21A and a second region 21B as shown in FIG. 4. In a first exposure process, an exposure is performed on the first region 21A by means of the mask 30. In a second exposure process, an exposure is performed on the second region 21B by means of the mask 30. A complete pattern of the touch sense electrode 24 or the touch drive electrode 26 is formed on the substrate 21 by means of the two exposures, thereby satisfying the need to produce the large-sized display panel or touch display panel by means of the low-generation production line.

The inventors found that in the above exposure processes, an area of the first region 21A adjacent to the second region 21B will be subjected to the two exposure processes, i.e. the first exposure and the second exposure. The area may be referred to as a substrate splicing exposure area, while an exposure area of the substrate 21 except the substrate splicing exposure area may be referred to as a substrate normal exposure area. FIG. 4 schematically shows a substrate splicing exposure area 21C for easy understanding. Theoretically, the metal mesh 10 shown in FIG. 1 can be formed after the splicing exposure, and each metal line 1 has a width $W_e$, and there is a space $S_e$ between every two adjacent metal lines 1. However, actually a line width of the metal line 1 formed in the substrate splicing exposure area 21C is less than the width $W_e$. As a result, in a display panel or touch display panel formed finally, the substrate splicing exposure area has a higher transmittance than the substrate normal exposure area, so that the substrate splicing exposure area has a greater luminance in displaying than the substrate normal exposure area. In other words, a mura phenomenon is generated.

Figure 5A:
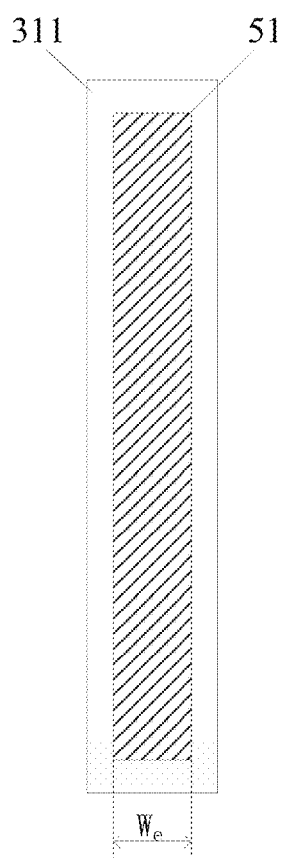
FIGS. 5A-5C are partial enlarged views schematically showing a substrate splicing exposure area in two exposure processes.
Figure 5B:
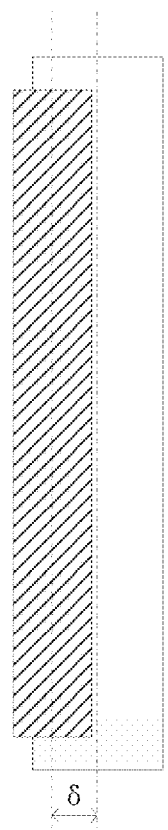
Figure 5C:

It was found by a further analysis that a reason for the generation of the mura phenomenon is an alignment deviation between the two exposure processes. Specifically, FIGS. 5A-5C are partial enlarged views schematically showing a substrate splicing exposure area in two exposure processes. As shown in FIG. 5A, in a first exposure process, a first metal line 51 having the width $W_e$ is formed in the substrate splicing exposure area due to a light blocking effect of the light blocking strip 311 of the mask 30. Then, as shown in FIG. 5B, in a second exposure process, due to a restriction imposed by factors such as a positioning accuracy of an exposure machine, the positional relationship in which the light-shielding strip 311 of the mask 30 and the first metal line 51 are completely aligned with each other as shown in FIG. 5A will not reproduced, but a position deviation δ between the light-shielding strip 311 of the mask 30 and the first metal line 51 will be generated. As a result, in the second exposure process, a portion of the first metal line 51 which is not shielded by the light blocking strip 311 will be exposed. The first metal line 51 formed finally is as shown in FIG. 5C. Since the portion of the first metal line 51 which is not shielded by the light blocking strip 311 is exposed in the second exposure process, a line width $W_e'$ of the first metal line 51 formed finally is less than the width $W_e$. A difference between the line width $W_e'$ and the width $W_e$ is in direct proportion to the position deviation between the two exposure processes.

Figure 6:
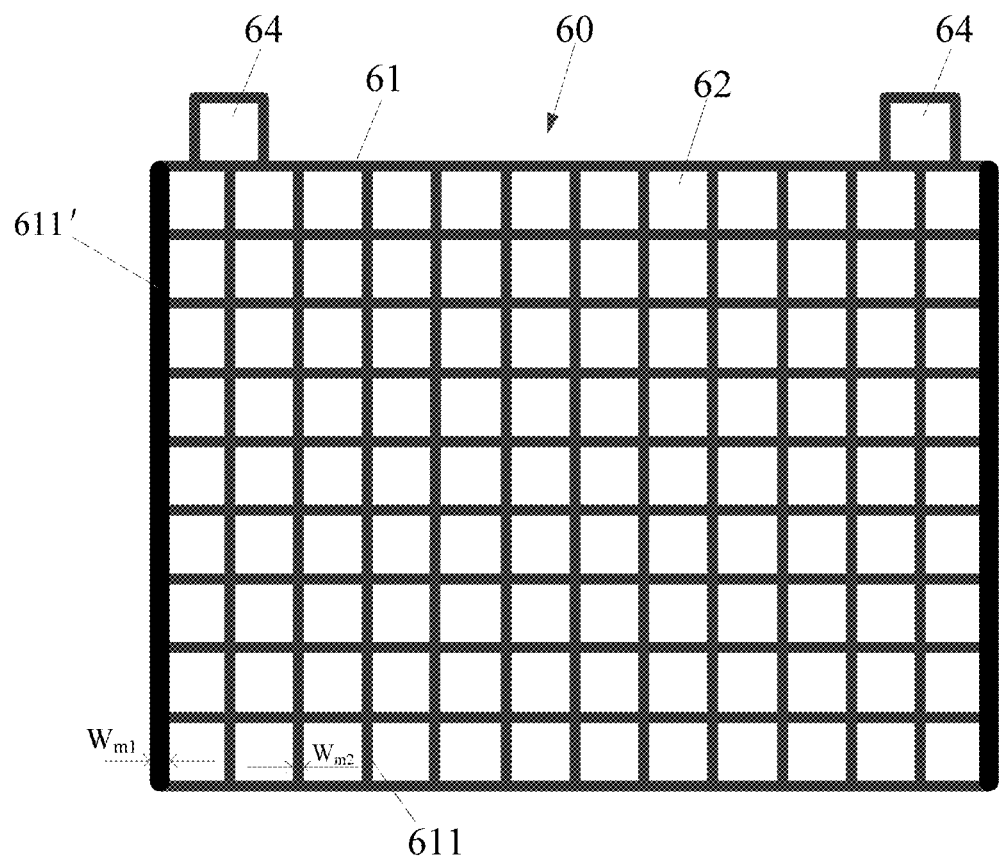
FIG. 6 is a schematic view showing a structure of a mask according to another embodiment of the present disclosure.

According to an exemplary embodiment of the present disclosure, there is provided a mask. As shown in FIG. 6, the mask 60 includes a light blocking part 61 and a light transmitting part 62. In the mask, the light blocking part 61 is configured to prevent a light from passing through the light blocking part 61 and the light transmitting part 62 is configured to allow a light to pass through the light transmitting part 62. The light blocking part 61 includes a plurality of light blocking strips which are arranged in a mesh shape, and the light transmitting part 62 is formed by spaces among the plurality of light blocking strips. The plurality of light blocking strips may include first light blocking strips 611' and second light blocking strips 611. Each of the first light blocking strips 611' corresponding to the substrate splicing exposure area has a first width $W_{m1}$. Each of the second light blocking strips 611 corresponding to the substrate normal exposure area has a second width $W_{m2}$. For example, the first light blocking strips 611' corresponding to the substrate splicing exposure area may be light blocking strips located in at least one side edge of the mask 60. In the embodiment shown in the figures, the first light blocking strips 611' corresponding to the substrate splicing exposure area are light blocking strips located in two side edges of the mask 60 in a first direction (a left-right direction in FIG. 6).

According to embodiments of the present disclosure, the first light blocking strips 611' corresponding to the substrate splicing exposure area may be light blocking strips located in two side edges of the mask 60 in the first direction (the left-right direction in FIG. 6) and located in two side edges of the mask 60 in a second direction (an up-down direction in FIG. 6).

In the present embodiment, the first light blocking strips 611' may be located in at least one side edge of the mask 60, and all the other light blocking strips of the light blocking strips except the first light blocking strips 611' are the second light blocking strips 611. For example, the second light blocking strips 611 may be located in a non-side-edge part of the mask 60. Referring to FIG. 6, the mask 60 includes four side edges, and the other positions of the mask 60 except the four side edges may be referred to as non-side-edge positions of the mask 60.

In the present embodiment, the first width $W_{m1}$ is greater than the second width $W_{m2}$. For example, the second width $W_{m2}$ may be equal to the width $W_m$, while the first width $W_{m1}$ is greater than the width $W_m$.

Figure 7:
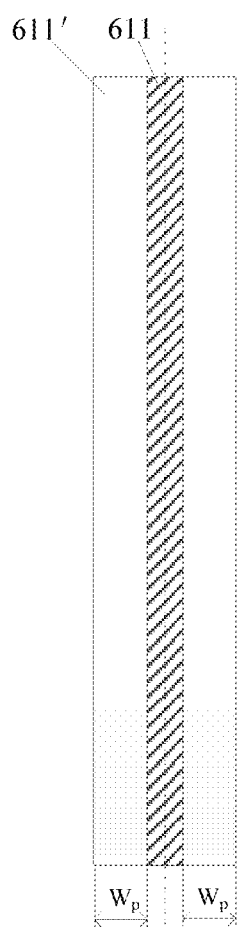
FIG. 7 is an enlarged view schematically showing a comparative relationship between a width of a first light blocking strip and a width of a second light blocking strip of the mask shown in FIG. 6.

According to embodiments of the present disclosure, FIG. 7 is an enlarged view showing the first light blocking strip and the second light blocking strip. As shown in FIG. 7, the first light blocking strip 611' is formed by unilaterally extending the second light blocking strip 611 by a width $W_p$. Herein, "unilaterally extending" means that an edge of the second light blocking strip on one side of the second light blocking strip is extended in a direction away from a central line of the second light blocking strip. For example, a left edge of the second light blocking strip 611 is extended leftwards, or a right edge of the second light blocking strip 611 is extended rightwards. In this case, there is a following relation between the first width $W_{m1}$ of the first light blocking strip 611' and the second width $W_{m2}$ of the second light blocking strip 611:

$$W_{m1}=W_{m2}+2W_p.$$

It should be noted that the unilaterally extended width $W_p$ is in direct proportion to the position deviation between two exposure processes.

Figure 8:
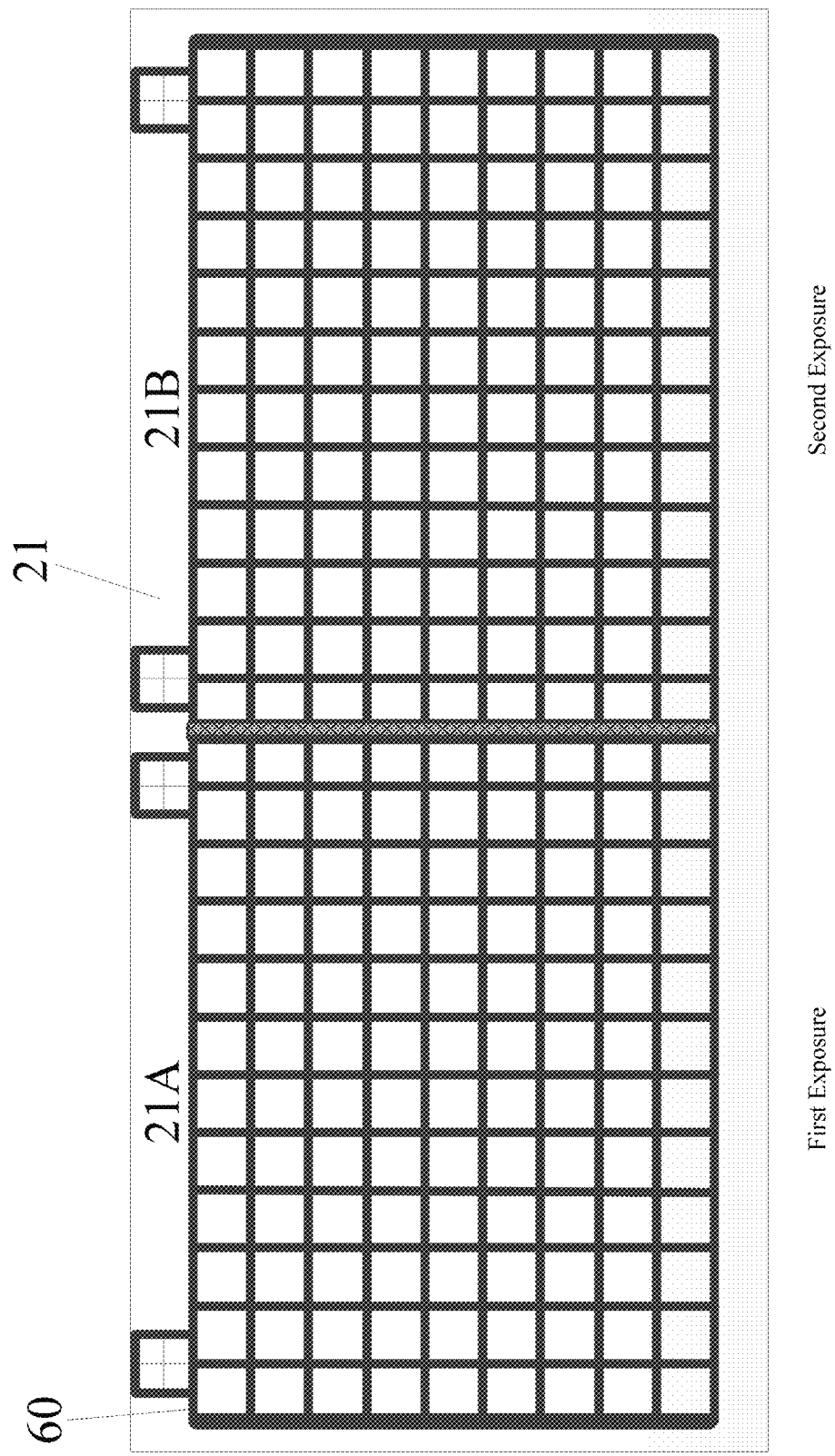
FIG. 8 is a schematic view schematically showing a performance of a splicing exposure process on a substrate using the mask shown in FIG. 6.
Figure 9A:
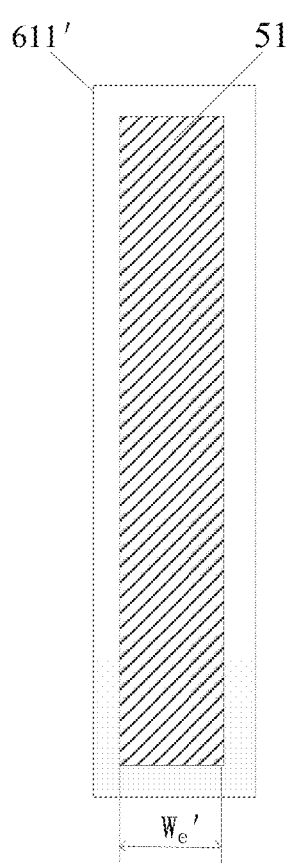
FIGS. 9A-9C are partial enlarged views schematically showing a substrate splicing exposure area in two exposure processes in the splicing exposure process shown in FIG. 8.
Figure 9B:
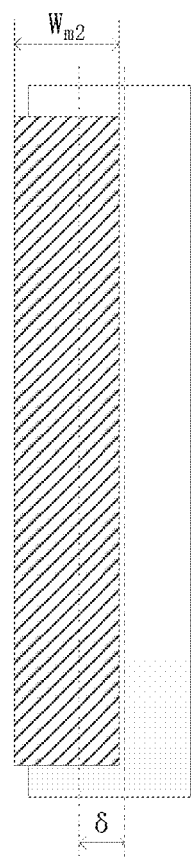
Figure 9C:

FIG. 8 is a schematic view schematically showing a performance of a splicing exposure process on a substrate 21 using the mask 60, and FIGS. 9A-9C are partial enlarged views schematically showing a splicing exposure region in two exposure processes. Referring to FIGS. 8 to 9C, in a first exposure process, an exposure is performed on the first region 21A by means of the mask 60, and in a second exposure process, an exposure is performed on the second region 21B by means of the mask 60. A complete pattern of the touch sense electrode 24 or the touch drive electrode 26 is formed on the substrate 21 by means of the two exposures. As shown in FIG. 9A, in the first exposure process, a first metal line 51 having a width $W_e'$ is formed in the substrate splicing exposure area 21C due to a light blocking effect of the first light blocking strip 611' of the mask 60. Since the first width $W_{m1}$ of the first light blocking strip 611' is greater than the width $W_m$, the width $W_e'$ of the formed first metal line 51 is greater than the width $W_e$. Then, as shown in FIG. 9B, in the second exposure process, due to a restriction imposed by factors such as a positioning accuracy of an exposure machine, a position deviation δ between the first light-shielding strip 611' of the mask 60 and the first metal line 51 will be generated. However, the first light blocking strip 611' has the first width $W_{m1}$ which is relatively wide, and the first metal line 51 has the width $W_e'$ which is relatively wide. Therefore, in the second exposure process, although there is still a case where the first metal line 51 and the first light blocking strip 611' partially overlap each other, with a design, an overlap between the first light blocking strip 611' and the first metal line 51 which are relatively wide may have a width that is equal to a width of the light blocking strip in the substrate normal exposure area, i.e. the second width $W_{m2}$ of the second light blocking strip 611. The first metal line 51 formed finally is as shown in FIG. 9C and has a line width equal to the width $W_e$. Therefore, a design in which some of the light blocking strips of the mask are widened can compensate for the position deviation between the two exposures so that in a display panel or touch display panel formed finally, such that the line width of the metal line in the substrate splicing exposure area is equal to the line width of the metal line in the substrate normal exposure area, thereby alleviating or even eliminating the mura phenomenon.

Based on a G6 production line of the BOE touch display panel factory, the inventors carried out a plurality of sets of tests by varying a plurality of sets of unilaterally extended widths $W_p$, as shown in the following Table 1.

TABLE 1

(which is a table of a relationship of a difference between the unilaterally extended width $W_p$ and the line width of the metal line)

| Unilaterally Extended Width $W_p$ (μm) | 10 | 12 | 14 | 16 |
|---|---|---|---|---|
| Difference Between Line Widths Of Metal Lines In Substrate Normal Exposure Area And Substrate Splicing Exposure Area (μm) | ≤1.3 | ≤1.2 | ≤0.8 | ≤10.5 |

According to the test data in Table 1, when the unilaterally extended width $W_p$ is 10 μm, the difference between the line widths of the metal lines in the substrate normal exposure area and the substrate splicing exposure area, which are finally formed, is less than or equal to 1.3 μm. In this case, the mura phenomenon in displaying is alleviated. With a gradual increase of the unilaterally extended width $W_p$, the difference between the line widths of the metal lines in the substrate normal exposure area and the substrate splicing exposure area, which are finally formed, gradually decreases. When the unilaterally extended width $W_p$ is 16 μm, the difference between the line widths of the metal lines in the substrate normal exposure area and the substrate splicing exposure area, which are finally formed, is less than or equal to 0.5 μm. In this case, in the display panel or touch display panel formed finally, the substrate splicing exposure area has substantially the same transmittance as the substrate normal exposure area, so that the substrate splicing exposure area has substantially the same luminance in displaying as the substrate normal exposure area. In other words, the mura phenomenon is substantially eliminated. In other words, when the unilaterally extended width $W_p$ is greater than or equal to 16 μm, the substrate splicing exposure area has substantially or completely the same transmittance in displaying as the substrate normal exposure area, so that the mura phenomenon is eliminated.

Referring back to FIG. 6, the second light blocking strip 611 of the mask 60 corresponding to the substrate normal exposure area has a second width $W_{m2}$. According to embodiments of the present disclosure, the second width $W_{m2}$ may be about 6 μm. In this way, when a touch drive electrode or touch sense electrode having a metal mesh structure is formed by performing an exposure process by means of the mask 60, a line width of a metal line of a formed metal mesh may be less than or equal to 5 μm. It was found by the inventors that a stripe eliminating effect of a touch display panel can be improved by forming a metal mesh electrode having such a small line width.

According to embodiments of the present disclosure, in the mask 60, a spacing between every two adjacent light blocking strips 611, 611' may be in a range of 100-300 μm, and according to embodiments of the present disclosure, the spacing may be in a range of 145-255 μm. In the case where the spacing between every two adjacent light blocking strips 611, 611' is in the range of 145-255 μm, a spacing between every two adjacent metal lines of the formed metal mesh may be in a range of 150-250 μm when the touch drive electrode or touch sense electrode having the metal mesh structure is formed by performing the exposure process by means of the mask 60. The stripe eliminating effect of the touch display panel can be further improved by forming the metal mesh electrodes having a small line width and a small spacing.

Figure 10A:
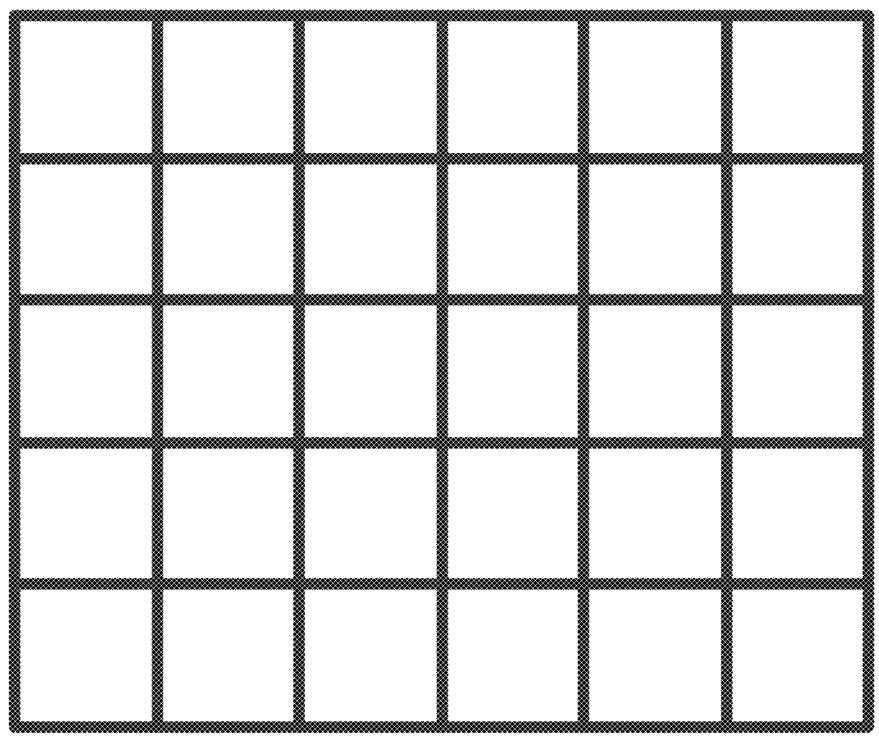
FIGS. 10A-10B show structures of metal mesh electrodes with different line widths and different spacings, respectively.
Figure 10B:
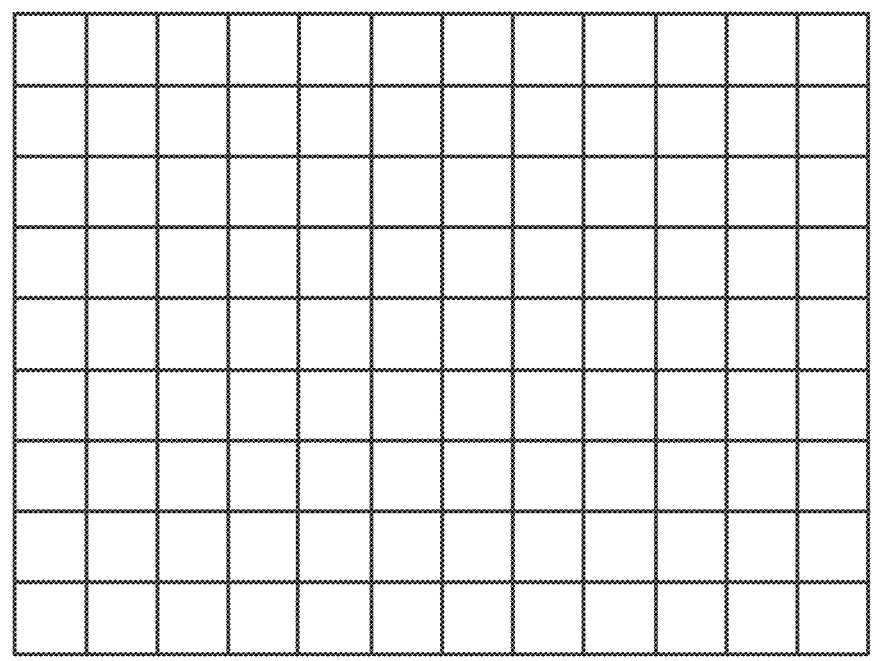

The inventors carried out comparative tests on a relationship between the stripe eliminating effect and the line width and spacing. A metal mesh for a first set of tests as shown in FIG. 10A has a line width of 8 μm and a spacing of 420 μm. A metal mesh for a second set of tests as shown in FIG. 10B has a line width of 5 μm and a spacing of 180 μm. A result of the comparative tests is as shown in the following Table 2.

TABLE 2

(which is a table of the relationship between the stripe eliminating effect and the line width and spacing)

| Line Width | Spacing | Stripe Eliminating Effect |
|---|---|---|
| 8 μm | 420 μm | Substantially Visible |
| 5 μm | 180 μm | Invisible |

According to test data in the Table 2, a metal line of the metal mesh is substantially visible to a naked eye when the metal mesh has the line width of 8 μm and the spacing of 420 μm, and a metal line of the metal mesh is invisible to the naked eye when the metal mesh has the line width of 5 μm and the spacing of 180 μm.

Furthermore, in a conventional process of forming a large-sized touch display panel by a splicing exposure, generally a mask is aligned with a substrate by means of a laser alignment. However, it was found by research by the inventors that the laser alignment has an alignment error in a range of ±150 μm so that a relative position between a metal mesh of a touch drive electrode and a metal mesh of a touch sense electrode of a produced touch display panel is unstable, thereby producing a moire.

In embodiments of the present disclosure, in a splicing exposure, a mask is aligned with a substrate by means of a mark alignment. Referring back to FIG. 6, the mask 60 is provided with a plurality of first alignment marks 64. For example, the first alignment mark 64 may be an alignment hole. Referring back to FIG. 4, the substrate 21 is provided with a plurality of second alignment marks 214. For example, the second alignment mark 214 may be a cross alignment mark.

Figure 11A:
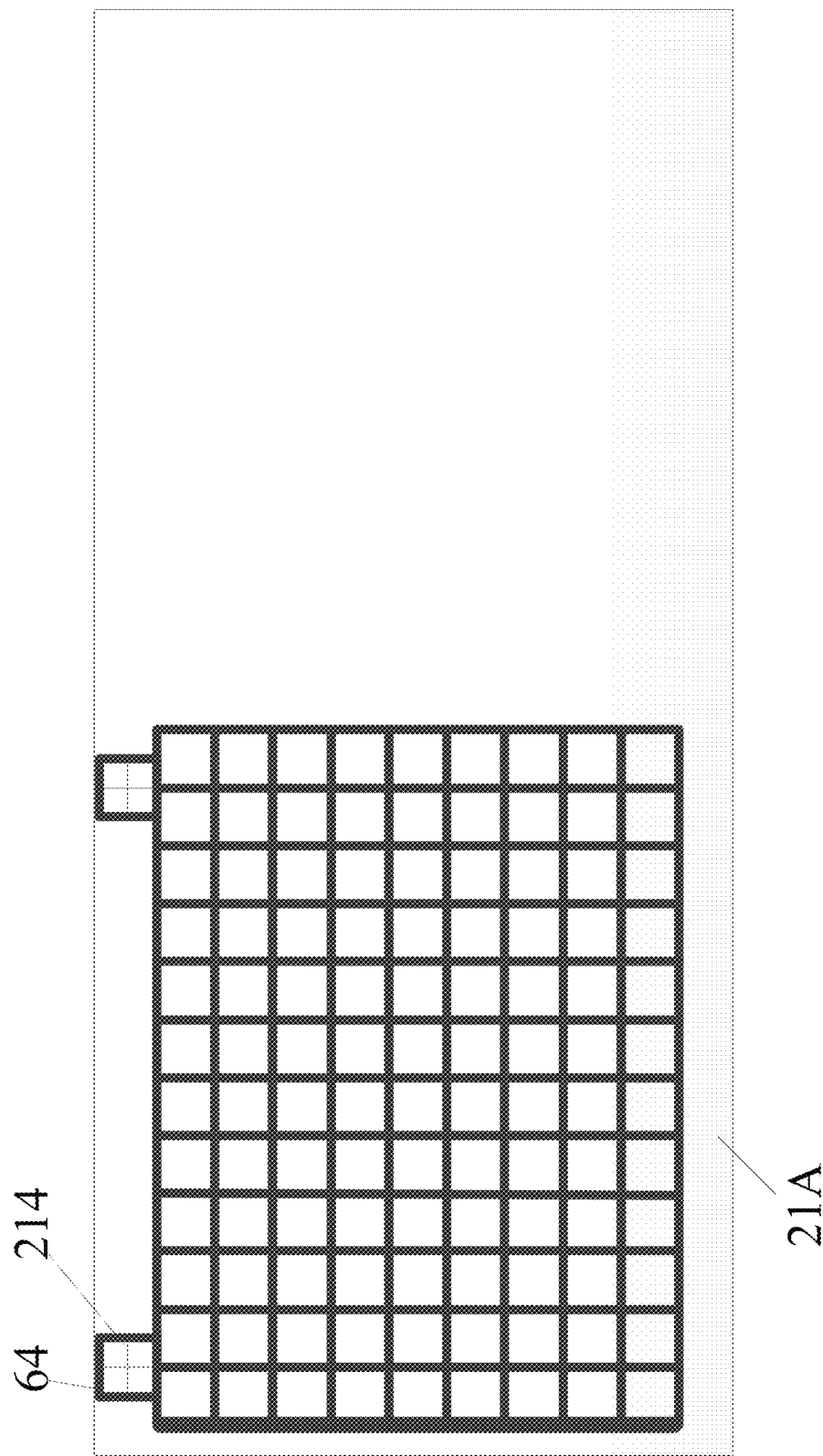
FIGS. 11A and 11B schematically show a splicing exposure process with a mark alignment according to an embodiment of the present disclosure.
Figure 11B:
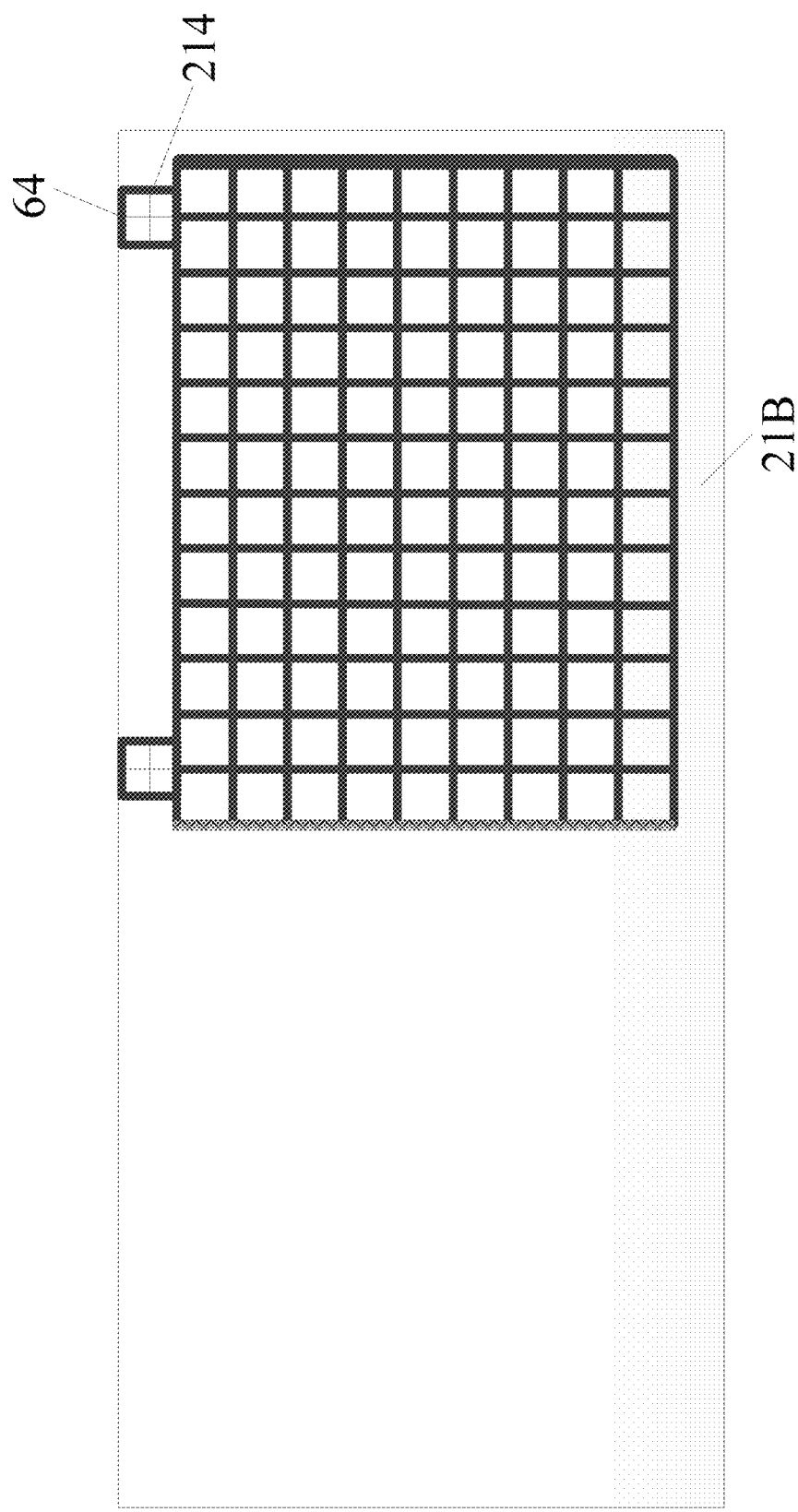

Referring to FIGS. 11A and 11B, a performance of a splicing exposure by means of a mark alignment will be described in more detail by still taking a splicing exposure including two exposures as an example.

In a first exposure process, the mask 60 is provided on its at least one side with a plurality of first alignment marks 64, and the first region 21A of the substrate 21 is provided in its at least one side edge with a plurality of second alignment marks 214. The substrate 21 is placed under the mask 60, so that the first alignment marks 64 are aligned with the corresponding second alignment marks 214, respectively, thereby aligning the mask 60 with the first exposure region of the substrate 21. Then, a first exposure is performed. After that, the substrate 21 is moved in a direction (i.e. a splicing direction), so that the plurality of first alignment marks 64 of the mask 60 are aligned with a plurality of second alignment marks 214 provided in at least one side edge of the second region 21B of the substrate 21, respectively, thereby aligning the mask 60 with the second exposure region of the substrate 21. Next, a second exposure is performed. Referring to FIGS. 5A, 5B and 5C, for example, the mask 60 is aligned with the second exposure region of the substrate 21, so that the light blocking strips 311 or the first light blocking strips 611' are aligned with a pattern of the first metal line 51 of the substrate splicing exposure area (referring to FIG. 5B). Due to a process restriction, the light blocking strips 311 or the first light blocking strips 611' cannot be completely or accurately aligned with the pattern of the first metal line 51 of the substrate splicing exposure area. According to embodiments of the present disclosure, the light blocking strips 311 or the first light blocking strips 611' of the mask 60 are configured to form a pattern of the common first metal line 51 in the first exposure region and the second exposure region of the substrate which are adjacent to each other (the pattern of the first metal line 51 in the substrate splicing exposure area). In other words, the first exposure region and the second exposure region are contiguous to each other, and have the pattern of the first metal line 51 common to them (the pattern of the first metal line 51 in the substrate splicing exposure area). After the second exposure, a difference between a line width of the pattern of the first metal line 51 in the substrate splicing exposure area and a line width of the pattern of the first metal line 51 in the substrate normal exposure area may be less than a second threshold such as 0.5 μm.

By means of the mark alignment, an alignment error between the mask and the substrate is in a range of ±3 μm. Therefore, a relative position between a metal mesh of a touch drive electrode and a metal mesh of a touch sense electrode of a produced touch display panel is relatively stable, thereby effectively avoiding the moire.

Figure 12:
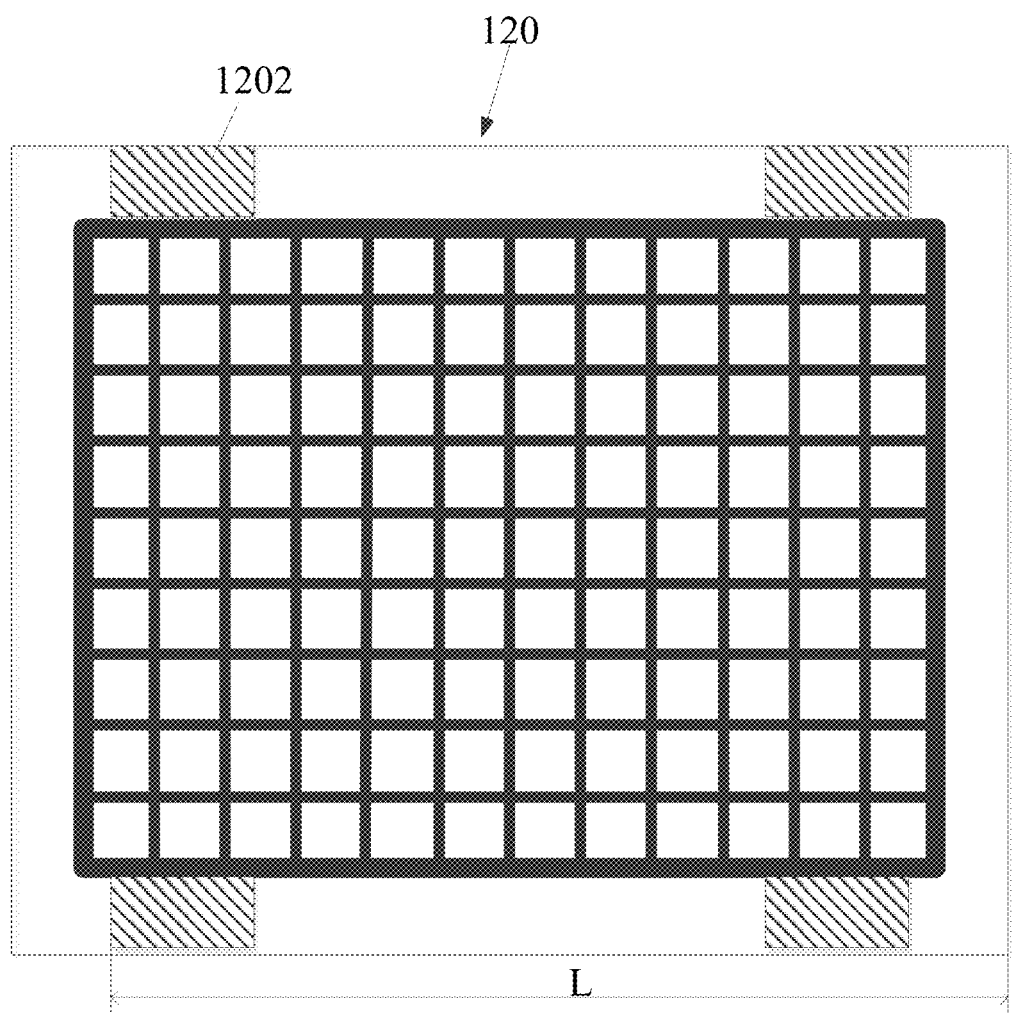
FIG. 12 is a schematic view showing a structure of a mask according to an embodiment of the present disclosure, in which a region where an alignment mask can be disposed is schematically shown.

An application of the mark alignment in a production of a large-sized touch display panel will be described in detail as below by taking the G6 production line of the BOE touch display panel factory as an example. As shown in FIG. 12, in the G6 production line, a region (a region 1202 indicated by inclined lines in the figure) of the mask where it is possible to dispose the alignment mask is relatively fixed, and a distance L between an edge of the mask and the region where it is possible to place the alignment mask is about 858 mm. Considering restrictive factors such as a size of the alignment mark itself and a placement of a camera on a platform of an exposure machine and further, in an actual process, generally an edge of a mask being not just aligned with an edge of a substrate, when a dimension of a short side of the substrate is less than 835 mm, i.e. when a difference between a size of the short side of the substrate and the distance L between the edge of the mask and the region where it is possible to place the alignment mask is greater than 20 mm, the substrate may be placed with the short side of the substrate in a long side direction of the mask. In other words, a splicing exposure may not need to be performed in a short side direction.

In the present embodiment, the substrate has long and short sides, and the mask 120 has a maximum alignment distance L that is a maximum one of distances between a position 1202 of the mask where the alignment mark is capable of being disposed on the mask 120 and the sides of the mask 120. For example, in FIG. 12, distances between four positions 1202 of the mask in each of which the alignment mark is capable of being disposed and corresponding four sides of the mask 120 are calculated, respectively, and then a maximum one of the distances is found as the maximum alignment distance L. After that, in the splicing exposure process, the short side of the substrate is compared with the maximum alignment distance L. When the maximum alignment distance L is greater than a length of the short side and a difference between the maximum alignment distance L and the length of the short side is greater than a first threshold (for example 20 mm), a splicing exposure process does not need to be performed in the short side direction of the substrate, and a splicing exposure process including a plurality of exposures needs to be performed only in a long side direction of the substrate. When the maximum alignment distance L is less than the length of the short side or the difference between the maximum alignment distance L and the length of the short side is less than the first threshold (for example 20 mm), a splicing exposure process needs to be performed in each of the short side direction and the long side direction of the substrate.

Figure 13:
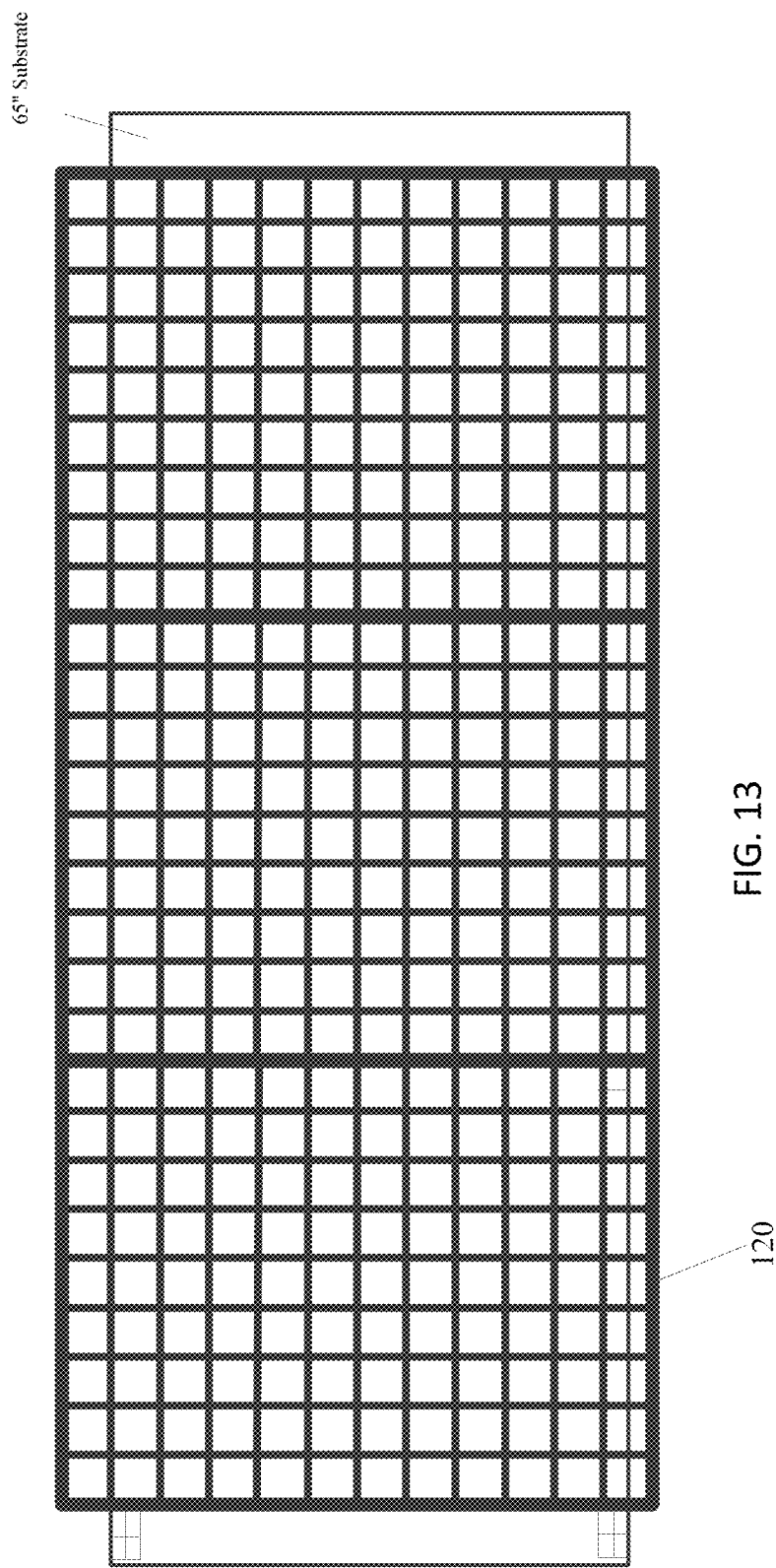
FIG. 13 schematically shows a process of performing a splicing exposure process on a 65" substrate using the mask shown in FIG. 12.

For example, a 65" touch display panel has overall dimensions of 1460 mm×831 mm. In this case, a substrate of the 65" touch display panel may be placed with a short side of the substrate along the long side of the mask 120. A splicing exposure may not need to be performed in the short side direction, and three exposures are performed in the long side direction. All the three exposures may be performed by means of the mark alignment. Thereby, a required pattern is formed on the substrate of the 65" touch display panel, as shown in FIG. 13.

For example, a 75" touch display panel has overall dimensions of 1687 mm×957 mm, and its short side has the size of 957 mm greater than 835 mm. In this case, a splicing exposure also needs to be performed on the substrate of the touch display panel in the short side direction. Specifically, two exposures need to be performed in the short side direction, and three exposures need to be performed in the long side direction. In other words, a total of six exposures need to be performed. Thereby, a required pattern is formed on the substrate of the 75" touch display panel. All the six exposures may also be performed by means of the mark alignment, as shown in FIG. 14.

Figure 15A:
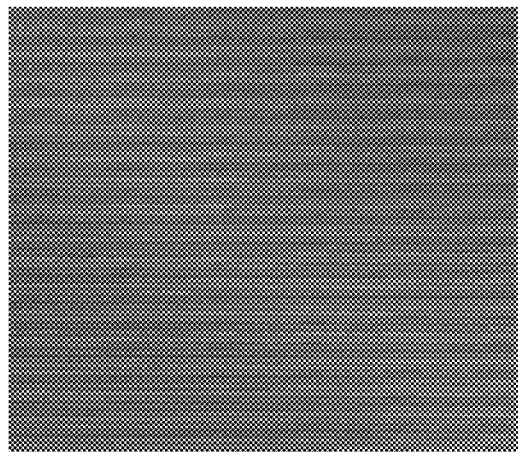
FIGS. 15A and 15B comparatively show moire phenomena of touch display panels respectively manufactured by means of a laser alignment and the mark alignment.
Figure 15B:
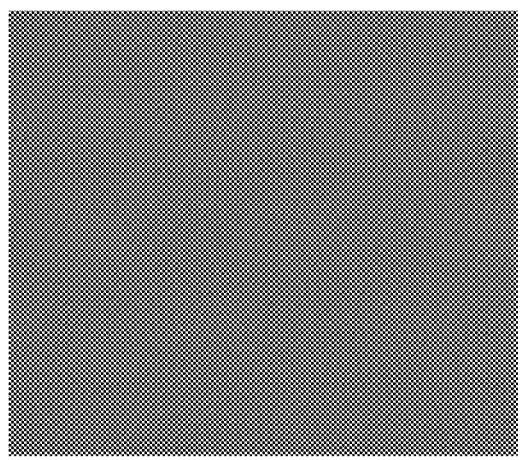

Referring to FIG. 15A, a 65" touch display panel manufactured by means of a laser alignment is shown, and it can be seen that an apparent moire phenomenon occurs in the 65" touch display panel. Referring to FIG. 15B, a 65" touch display panel manufactured by means of the mark alignment is shown, and it can be seen that no moire phenomenon occurs in the 65" touch display panel.

Figure 16:
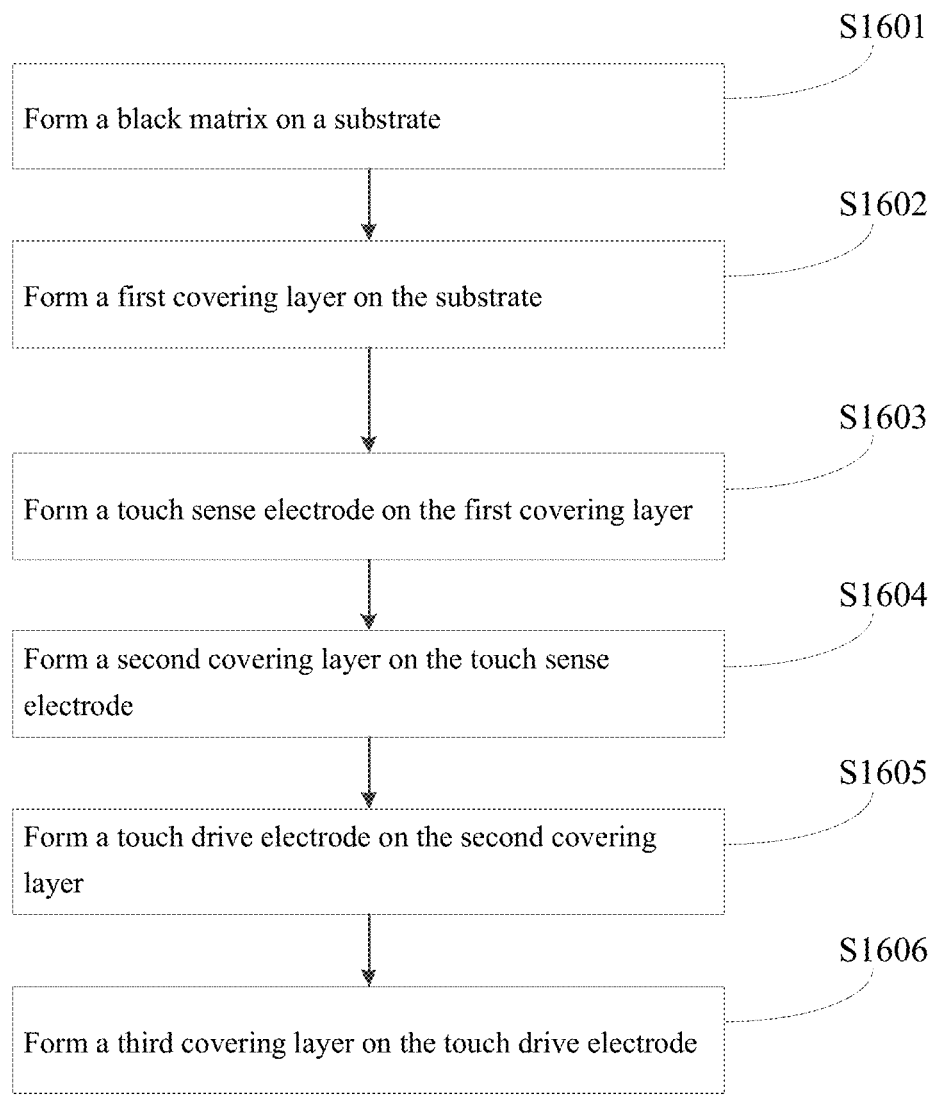
FIG. 16 is a flow diagram of a method of manufacturing a one-glass solution (OGS) touch display panel according to an embodiment of the present disclosure.

FIG. 16 is a flow diagram of a method of manufacturing a one-glass solution (OGS) touch display panel. The splicing exposure process according to the embodiments of the present disclosure is used in the method. The method of manufacturing the OGS touch display panel is described in detail as below with reference to FIGS. 16 and 2.

In a step S1601, a black matrix 22 is formed on a substrate 21. For example, a pattern of the black matrix 22 may be formed by a first patterning process. The first patterning process may include a photoresist applying step, an exposing step and a developing step.

In a step S1602, a first covering layer 23 covering the black matrix 22 is formed on the substrate 21. For example, a pattern of the first covering layer 23 may be formed by a second patterning process. The second patterning process may include a photoresist applying step, an exposing step and a developing step.

In a step S1603, a touch sense electrode 24 is formed on the first covering layer 23. The touch sense electrode 24 may have a metal mesh structure. For example, a pattern of the touch sense electrode 24 may be formed by a third patterning process. The third patterning process may include a metal evaporating step, a photoresist applying step, an exposing step, a developing step and an etching step. For example, the above splicing exposure may be used in the exposure of the third patterning process.

In a step S1604, a second covering layer 25 is formed on the touch sense electrode 24. For example, a pattern of the second covering layer 25 may be formed by a fourth patterning process. The fourth patterning process may include a photoresist applying step, an exposing step and a developing step.

In a step S1605, a touch drive electrode 26 is formed on the second covering layer 25. The touch drive electrode 26 may have a metal mesh structure. For example, a pattern of the touch drive electrode 26 may be formed by a fifth patterning process. The fifth patterning process may be the same as the third patterning process and may include a metal evaporating step, a photoresist applying step, an exposing step, a developing step and an etching step. For example, the above splicing exposure may be used in the exposure of the fifth patterning process.

In a step S1606, a third covering layer 27 is formed on the touch drive electrode 26. For example, a pattern of the third covering layer 27 may be formed by a sixth patterning process. The sixth patterning process may include a photoresist applying step, an exposing step and a developing step.

Figure 17:
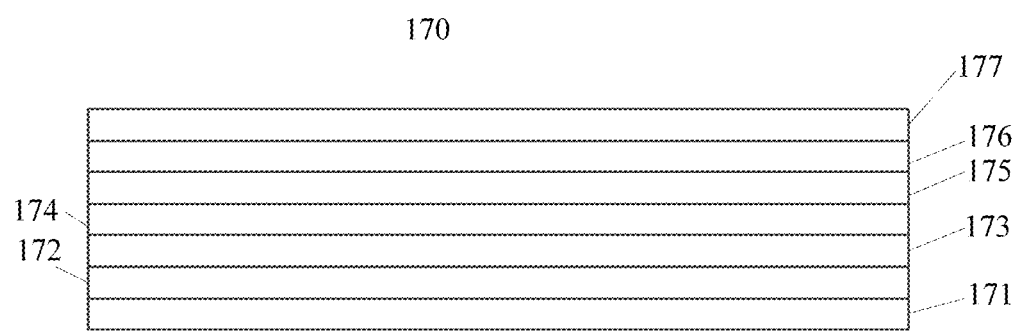
FIG. 17 is a schematic view showing a structure of a touch display panel according to another embodiment of the present disclosure.

Taking a glass-glass (GG) touch display panel as an example, as shown in FIG. 17, the touch display panel 170 may include: a first substrate 171; a touch drive electrode 172 disposed on the first substrate 171; a first covering layer (overcoat (OC)) 173 disposed on the touch drive electrode 172; a touch sense electrode 174 disposed on the first covering layer 173; a second covering layer 175 disposed on the touch sense electrode 174; an adhesive material layer 176 disposed on the second covering layer 175; and a second substrate 177 disposed on the adhesive material layer 176. At least one of the touch sense electrode 174 and the touch drive electrode 172 may include the metal mesh structure. The first substrate 171 and the second substrate 177 may be glass substrates.

Figure 18:
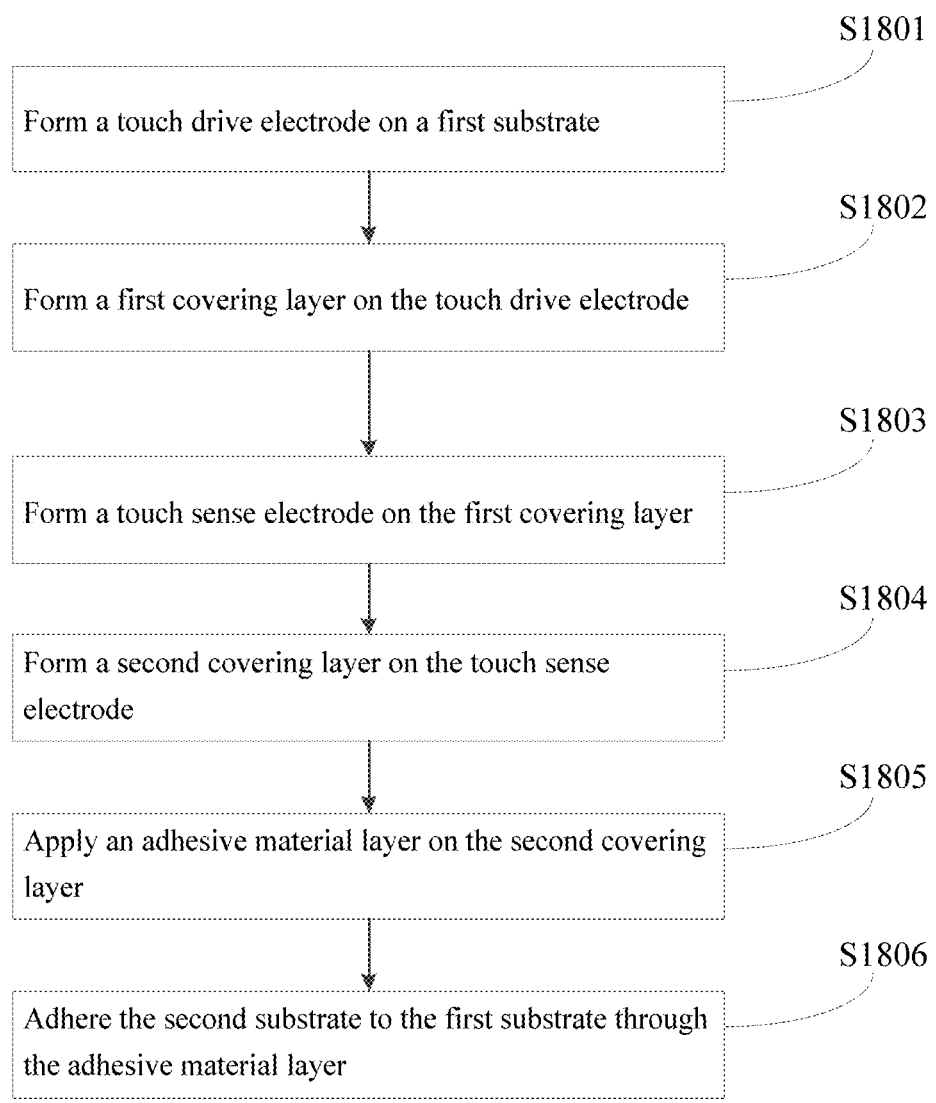
FIG. 18 is a flow diagram of a method of manufacturing a glass-glass (GG) touch display panel according to an embodiment of the present disclosure.

FIG. 18 is a flow diagram of a method of manufacturing the GG touch display panel. The splicing exposure process according to the embodiments of the present disclosure is applied in the method. The method of manufacturing the GG touch display panel is described in detail as below with reference to FIGS. 17 and 18.

In a step S1801, a touch drive electrode 172 is formed on a first substrate 171. The touch drive electrode 172 may have a metal mesh structure. For example, a pattern of the touch drive electrode 172 may be formed by a first patterning process. The first patterning process may include a metal evaporating step, a photoresist applying step, an exposing step, a developing step and an etching step. For example, the above splicing exposure process may be used in the exposure step of the first patterning process.

In a step S1802, a first covering layer 173 is formed on the touch drive electrode 172. For example, a pattern of the first covering layer 173 may be formed by a second patterning process. The second patterning process may include a photoresist applying step, an exposing step and a developing step.

In a step S1803, a touch sense electrode 174 is formed on the first covering layer 173. The touch sense electrode 174 may have a metal mesh structure. For example, a pattern of the touch sense electrode 174 may be formed by a third patterning process. The third patterning process may include a metal evaporating step, a photoresist applying step, an exposing step, a developing step and an etching step. For example, the above splicing exposure process may be used in the exposure of the third patterning process.

In a step S1804, a second covering layer 175 is formed on the touch sense electrode 174. For example, a pattern of the second covering layer 175 may be formed by a fourth patterning process. The fourth patterning process may include a photoresist applying step, an exposing step and a developing step.

In a step S1805, an adhesive material layer 176 is applied on the second covering layer 175.

In a step S1806, the second substrate 177 is adhered to the first substrate 171 through the adhesive material layer 176.

Figure 19:
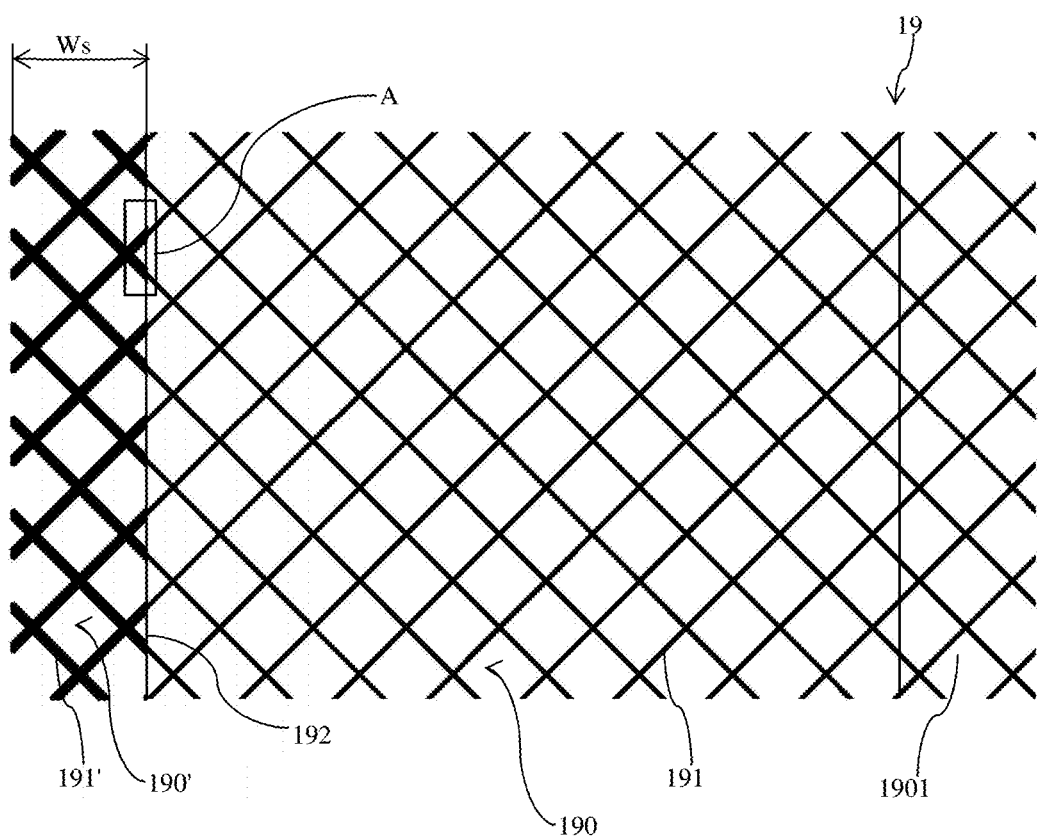
FIG. 19 is a schematic view showing a structure of a mask according to still another embodiment of the present disclosure.
Figure 20:
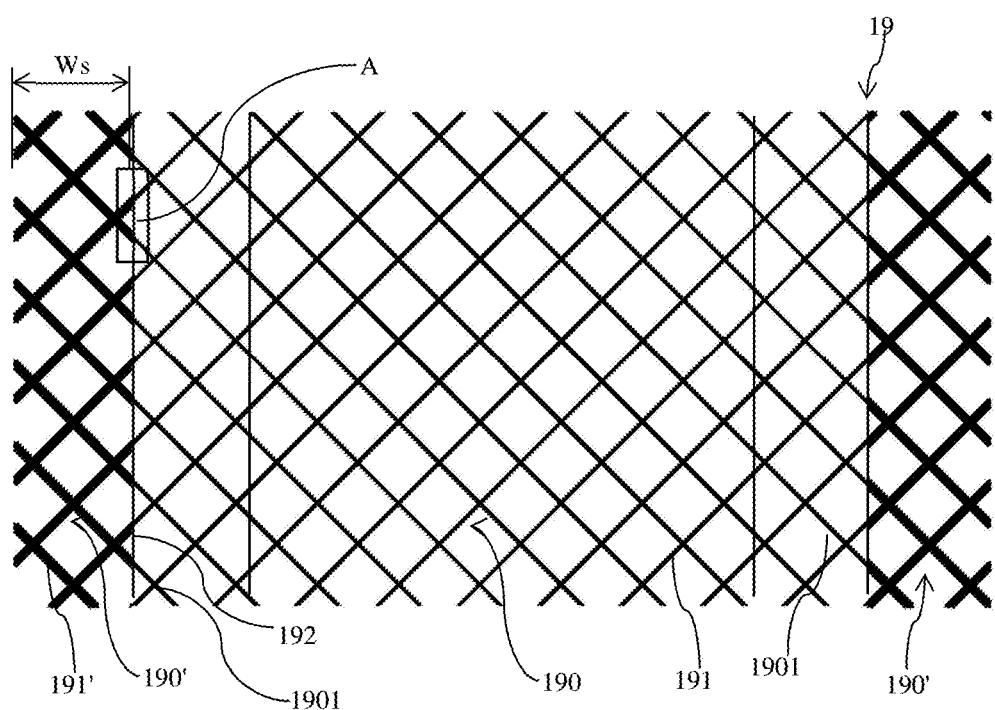
FIG. 20 is a schematic view showing a structure of a mask according to yet another embodiment of the present disclosure.
Figure 21:
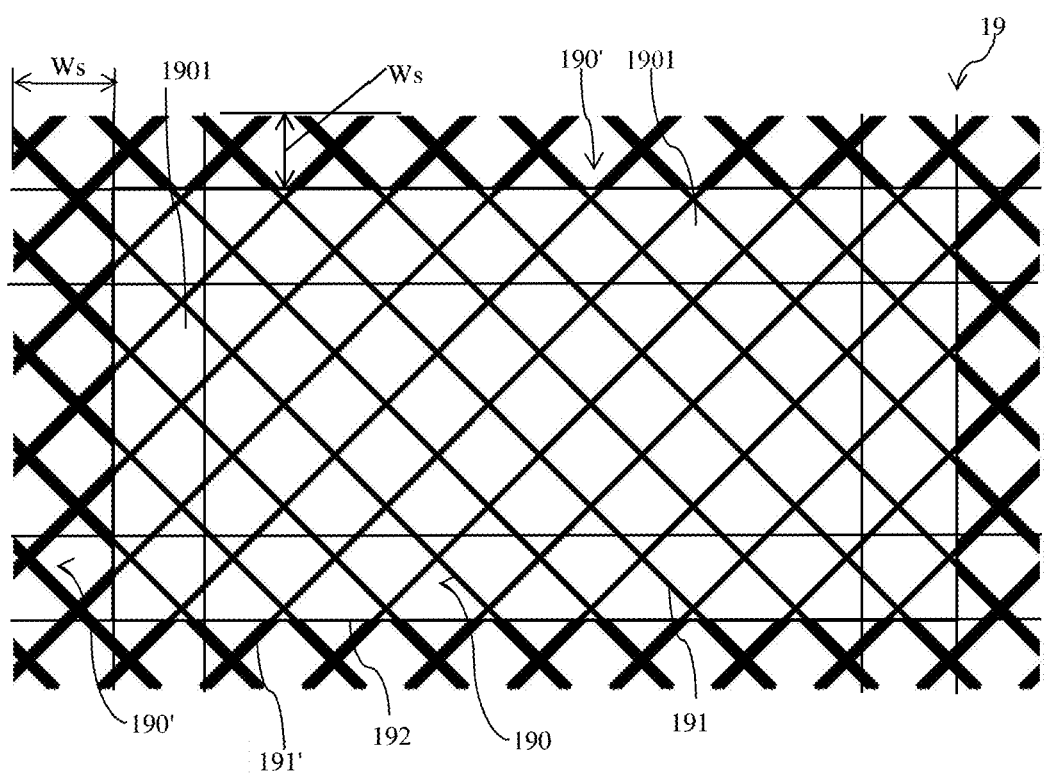
FIG. 21 is a schematic view showing a structure of a mask according to a further embodiment of the present disclosure.
Figure 22:
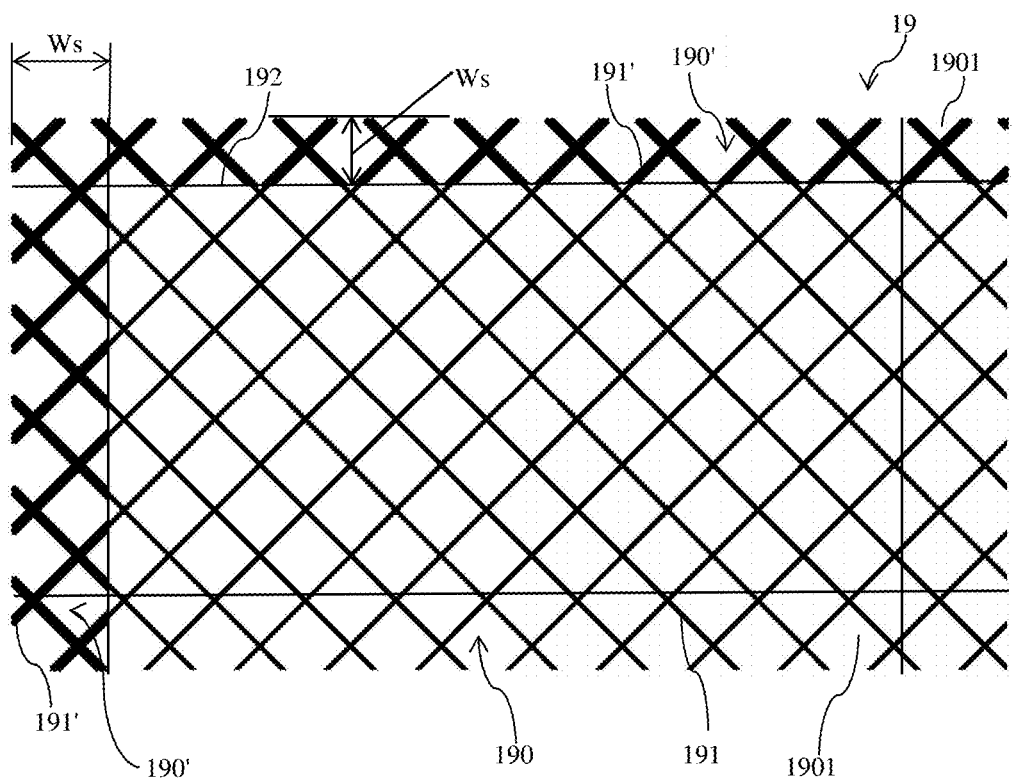
FIG. 22 is a schematic view showing a structure of a mask according to a still further embodiment of the present disclosure.
Figure 23:
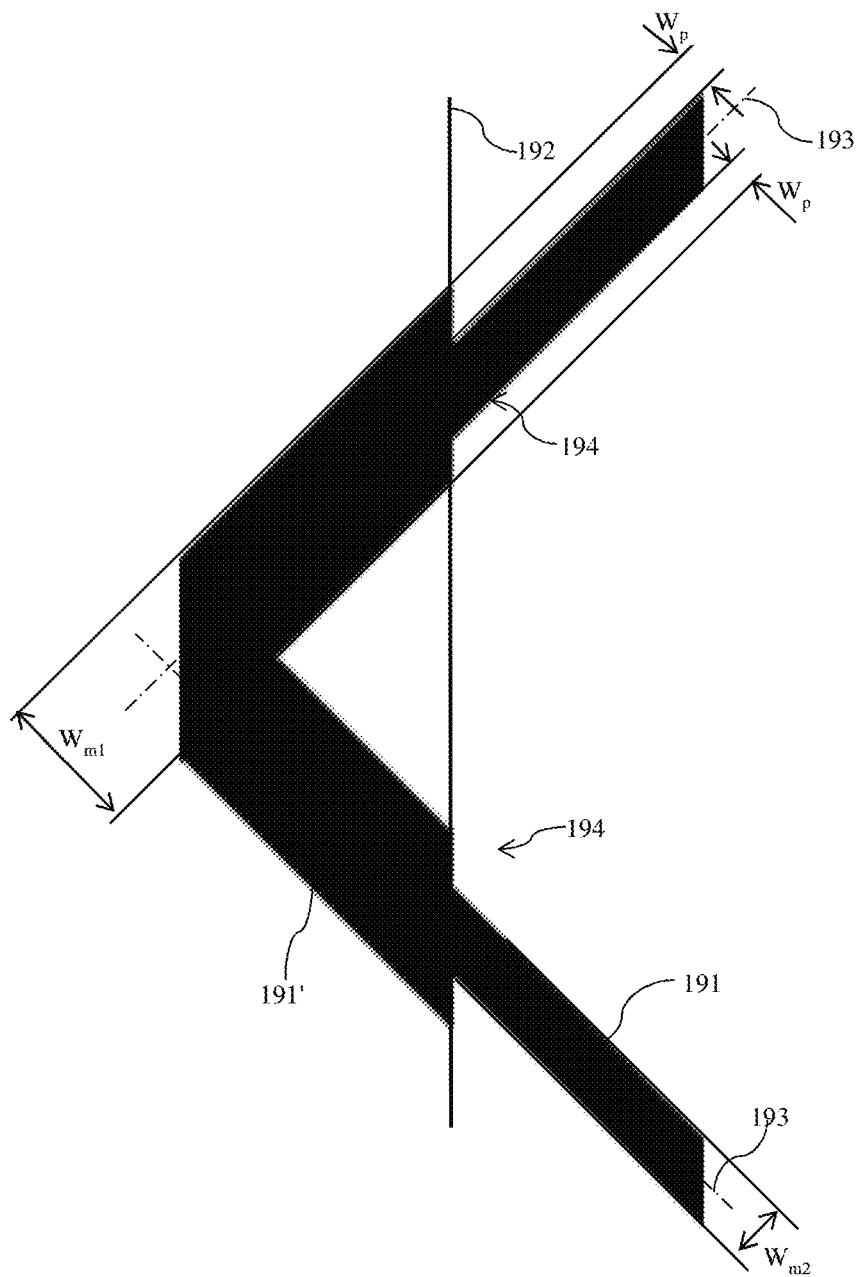
FIG. 23 is a partial enlarged view of the portion A of each of the masks shown in FIGS. 19 and 20.

FIG. 19 is a schematic view showing a structure of a mask 19 according to still another embodiment of the present disclosure; FIG. 20 is a schematic view showing a structure of a mask 19 according to yet another embodiment of the present disclosure; FIG. 21 is a schematic view showing a structure of a mask 19 according to a further embodiment of the present disclosure; and FIG. 22 is a schematic view showing a structure of a mask 19 according to a still further embodiment of the present disclosure; and FIG. 23 is a partial enlarged view of the portion A of each of the masks 19 shown in FIGS. 19 and 20.

Referring to FIGS. 19 to 23, according to some exemplary embodiments of the present disclosure, there is provided a mask 19. The mask 19 includes: a plurality of light blocking strips 191' and 191 configured to block a light and bounding spaces through which a light is allowed to pass. The plurality of light blocking strips 191' and 191 are arranged in a mesh shape, and include first light blocking strips 191' located in a side edge of the mask, and second light blocking strips 191, and each of the first light blocking strips 191' has a greater width than each of the second light blocking strips 191.

Referring to FIGS. 19 to 23, according to some exemplary embodiments of the present disclosure, the mask 19 further includes: a mask normal exposure area 190; and a mask splicing exposure area 190' constituted by the side edge of the mask 19 and adjoining the mask normal exposure area 190. There is a boundary line 192 between the mask splicing exposure area 190' and the mask normal exposure area 190, the first light blocking strips 191' of the plurality of light blocking strips 191' and 191 are located in the mask splicing exposure area 190' and are disposed crosswise in a mesh shape, and the second light blocking strips 191 of the plurality of light blocking strips 191' and 191 are located in the mask normal exposure area 190 and are disposed crosswise in a mesh shape.

According to still another exemplary embodiment of the present disclosure, there is provided a mask 19. As shown in FIGS. 19 to 23, the mask 19 includes a light blocking part and a light transmitting part. In the mask, the light blocking part is configured to prevent a light from passing through the light blocking part and the light transmitting part is configured to allow a light to pass through the light transmitting part. The light blocking part includes a plurality of light blocking strips 191' and 191 arranged in a mesh shape. The light transmitting part is formed by spaces among the plurality of light blocking strips 191' and 191. The plurality of light blocking strips 191' and 191 may include first light blocking strips 191' and second light blocking strips 191. The first light blocking strips 191' corresponding to the mask splicing exposure area 190' each have a first width $W_{m1}$. The second light blocking strips 191 corresponding to the mask normal exposure area 190 each have a second width $W_{m2}$. For example, the first light blocking strips 191' corresponding to the mask splicing exposure area 190' may be light blocking strips 191' located in at least one side edge of the mask 19.

In the embodiment shown in FIG. 19, the first light blocking strips 191' corresponding to the mask splicing exposure area 190' are light blocking strips 191' located in a left side edge of the mask 19 in a first direction (a left-right direction in FIG. 19). In the embodiment shown in FIG. 20, the first light blocking strips 191' corresponding to the mask splicing exposure area 190' are light blocking strips 191' located in two side edges of the mask 19 in the first direction (the left-right direction in FIG. 20). In the embodiment shown in FIG. 21, the first light blocking strips 191' corresponding to the mask splicing exposure area 190' are light blocking strips 191' located in two side edges of the mask 19 in the first direction (the left-right direction in FIG. 21) and light blocking strips 191' located in two side edges of the mask 19 in a second direction (an up-down direction in FIG. 21). Further, in the embodiment shown in FIG. 22, the first light blocking strips 191' corresponding to the mask splicing exposure area 190' are light blocking strips 191' located in two adjacent side edges (an upper side edge and a left side edge) of the mask 19. In the present embodiment, the first light blocking strips 191' may be located in at least one side edge of the mask 19, and all the other light blocking strips 191 of the light blocking strips except the first light blocking strips 191' are the second light blocking strips 191. For example, in the example shown in FIG. 21, the second light blocking strips 191 may be located in a non-side-edge part of the mask 19. Referring to FIGS. 19 to 22, the mask 19 includes four side edges, and the other positions of the mask 19 except the four side edges may be referred to as non-side-edge positions of the mask 19.

According to embodiments of the present disclosure, the mask splicing exposure area 190' may be disposed in the mask 19 according to exposure requirements and is not limited to the embodiments shown in the figures. In addition, the side edge of the mask 19 may have a rectangular shape, the mask splicing exposure area 190' may have a rectangular shape, the mask 19 may have a rectangular shape, and the mask normal exposure area 190 may have a rectangular shape.

In the present embodiment, the first width $W_{m1}$ is greater than the second width $W_{m2}$. For example, the second width $W_{m2}$ may be equal to the width Wm, while the first width $W_{m1}$ is greater than the width Wm.

According to embodiments of the present disclosure, FIG. 23 is an enlarged view showing the first light blocking strip 191' and the second light blocking strip 191. As shown in FIG. 23, the first light blocking strip 191' is formed by unilaterally extending the second light blocking strip 191 by a width $W_p$. In this way, there is a following relation between the first width $W_{m1}$ of the first light blocking strip 191' and the second width $W_{m2}$ of the second light blocking strip 191:

$$W_{m1}=W_{m2}+2W_p.$$

It should be noted that the unilaterally extended width $W_p$ is in direct proportion to the position deviation between the two exposure processes.

Referring to FIG. 23, according to embodiments of the present disclosure, the second light blocking strips 191 of the mask 19 corresponding to the mask normal exposure area 190 each have a second width $W_{m2}$. According to embodiments of the present disclosure, the second width $W_{m2}$ may be about 6 μm. In this way, when a touch drive electrode or touch sense electrode having a metal mesh structure is formed by performing an exposure process by means of the mask 19, a line width of a metal line of a formed metal mesh may be less than or equal to 5 μm. A stripe eliminating effect of a touch display panel can be improved by forming a metal mesh electrode having such a small line width.

According to embodiments of the present disclosure, in the mask 19, a spacing between every two adjacent light blocking strips 191', 191 may be in a range of 100-300 μm, and according to embodiments of the present disclosure, the spacing may be in a range of 145-255 μm. In the case where the spacing between every two adjacent light blocking strips 191', 191 is in the range of 145-255 μm, a spacing between every two adjacent metal lines of the formed metal mesh may be in a range of 150-250 μm when the touch drive electrode or touch sense electrode having the metal mesh structure is formed by performing the exposure process by means of the mask 19. The stripe eliminating effect of the touch display panel can be further improved by forming the metal mesh electrodes having a small line width and a small spacing.

Figure 28:
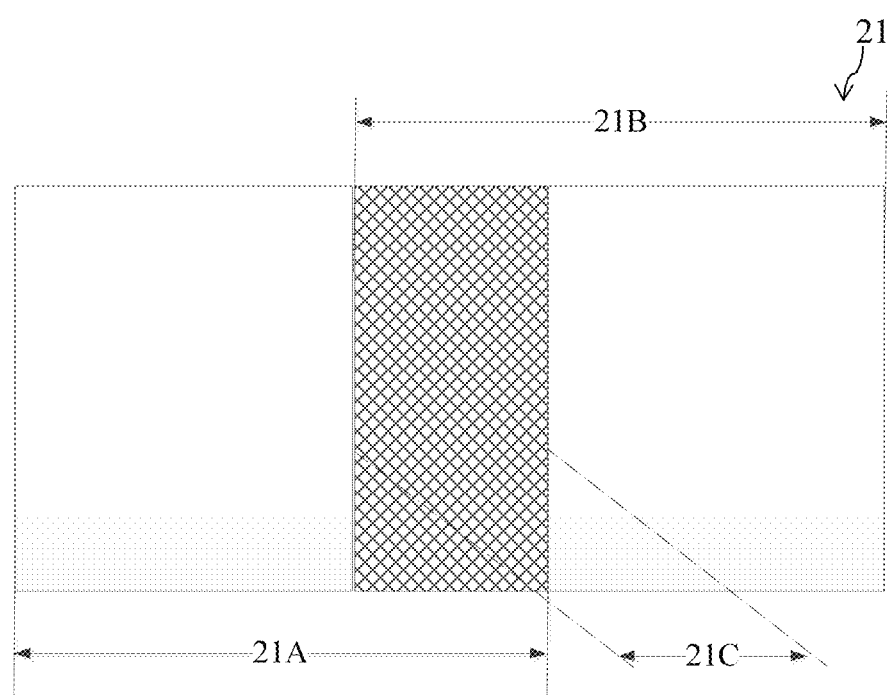
FIG. 28 is a schematic top view of a substrate of a touch display panel according to an embodiment of the present disclosure.

FIG. 28 shows a substrate 21 of a touch display panel according to an embodiment of the present disclosure. The substrate 21 includes a first exposure region 21A and a second exposure region 21B adjacent to each other, and a substrate splicing exposure area 21C. The substrate splicing exposure area 21C is an overlap area where the first exposure region 21A and the second exposure region 21B overlap each other. When a touch drive electrode or touch sense electrode having a metal mesh structure is manufactured, a metal layer is formed on the substrate 21 formed with other layers or no other layer. Then, a photoresist layer is applied to the metal layer, a splicing exposure process is performed on the photoresist layer by means of the mask 19, and the exposed photoresist layer is developed to form a photoresist pattern. After that, the metal layer is etched by means of the photoresist pattern, thereby forming the touch drive electrode or touch sense electrode having the metal mesh structure. When the splicing exposure process is performed, an exposure is performed on the first exposure region 21A by means of the mask 19, and then an exposure is performed on the second exposure region 21B by means of the mask 19. Each of the first exposure region 21A and the second exposure region 21B is subjected to one exposure except the substrate splicing exposure area 21C, while the substrate splicing exposure area 21C is subjected to two exposures. The substrate 21 of the touch display panel may have a rectangular shape. An embodiment in which the splicing exposure processes need to be performed on the substrate 21 of the touch display panel in two directions respectively is similar to the above embodiment and is no longer described for the sake of brevity.

According to embodiments of the present disclosure, referring to FIGS. 19 to 22 and 28, the light blocking strips 191' or the first light blocking strips 191' of the mask 19 are configured to form a pattern of the common metal line of a touch drive electrode or touch sense electrode, having a metal mesh structure, in the first exposure region 21A and the second exposure region 21B of the substrate 21 which are adjacent to each other (the pattern of the metal line in the substrate splicing exposure area 21C). After the second exposure, a difference between a line width of the pattern of the metal line in the substrate splicing exposure area and a line width of the pattern of the metal line in the substrate normal exposure area may be less than a second threshold value such as 0.5 μm.

As shown in FIGS. 19 to 28, according to some exemplary embodiments of the present disclosure, there is provided a mask 19. The mask 19 includes: a plurality of light blocking strips 191' and 191 arranged in a mesh shape; a mask normal exposure area 190; and a mask splicing exposure area 190' constituted by a side edge of the mask 19 and adjoining the mask normal exposure area 190. There is a boundary line 192 between the mask splicing exposure area 190' and the mask normal exposure area 190. The plurality of light blocking strips 191' and 191 include: a plurality of first light blocking strips 191' located in the mask splicing exposure area 190' and disposed crosswise in a mesh shape; and a plurality of second light blocking strips 191 located in the mask normal exposure area 190 and disposed crosswise in a mesh shape. Furthermore, each of the plurality of first light blocking strips 191' has a greater width than each of the plurality of second light blocking strips 191. The mask 19 may have a rectangular shape, and the mask splicing exposure area 190' may have a rectangular shape.

As shown in FIGS. 19 to 28, according to some exemplary embodiments of the present disclosure, the mask 19 further includes: an overlap region 1901. At least a portion of the overlap region 1901 is constituted by a part of the mask normal exposure area 190, the overlap region 1901 has a same size as the mask splicing exposure area 190', and center lines 193 of the light blocking strips 191 located in the overlap region 1901 and including the second light blocking strips 191 or center lines 193 of the light blocking strips 191' and 191 located in the overlap region 1901 and including the first light blocking strips 191' and the second light blocking strips 191 form a same pattern as center lines 193 of the first light blocking strips 191' located in the mask splicing exposure area 190'. For example, the pattern formed by the center lines 193 of the light blocking strips 191 located in the overlap region 1901 and including the second light blocking strips 191 or the center lines 193 of the light blocking strips 191' and 191 located in the overlap region 1901 and including the first light blocking strips 191' and the second light blocking strips 191, and the pattern formed by the center lines 193 of the first light blocking strips 191' located in the mask splicing exposure area 190' coincide with each other when superposed. According to the embodiments of the present disclosure, the mask 19 includes the overlap region 1901 including at least the second light blocking strips 191, and the mask splicing exposure area 190' including only the first light blocking strips 191'. When the splicing exposure process is performed on the substrate splicing exposure area 21C of the substrate, one exposure is performed on at least most of the substrate splicing exposure area 21C by means of the second light blocking strips 191 in the overlap region 1901, and one exposure is performed on at least most of the substrate splicing exposure area 21C by means of the mask splicing exposure area 190'. Thereby, a touch drive electrode or touch sense electrode having a metal mesh structure is formed. A line width of the pattern of the metal line of the touch drive electrode or touch sense electrode in the substrate splicing exposure area 21C is substantially the same as a line width of the pattern of the metal line of the touch drive electrode or touch sense electrode in the substrate normal exposure area, and will not be too wide or two narrow. The line width of the pattern of the metal line in the substrate splicing exposure area 21C is probably too wide if two exposures are performed on the substrate splicing exposure area 21C only by means of the mask splicing exposure area 190', and the line width of the pattern of the metal line in the substrate splicing exposure area 21C is probably too narrow if two exposures are performed on the substrate splicing exposure area 21C only by means of the mask normal exposure area 190.

As shown in FIGS. 19 to 28, according to some exemplary embodiments of the present disclosure, the first light blocking strips 191' include: first light blocking strips 191' extending in a first direction; and first light blocking strips 191' extending in a second direction, and the second light blocking strips 191 include: second light blocking strips 191 extending in the first direction; and second light blocking strips 191 extending in the second direction, and center lines 193 of the plurality of light blocking strips 191' and 191 including the first light blocking strips 191' and the second light blocking strips 191 include: first center lines 193 extending in the first direction; and second center lines 193 extending in the second direction, and the first center lines 193 and the second center lines 193 are disposed crosswise in a uniform mesh shape. According to an example of the present disclosure, referring to FIG. 23, one of the first light blocking strips 191' and one of the second light blocking strips 191, intersecting the boundary line 192 at a same point of intersection 194 and extending in a same one of the first direction and the second direction, have a common center line 193.

As shown in FIG. 19, according to some exemplary embodiments of the present disclosure, the mask 19 further includes: an overlap region 1901 constituted by a part of the mask normal exposure area 190. The overlap region 1901 and the mask splicing exposure area 190' are constituted by two opposite side edges of the mask 19, respectively, and have a same size, and center lines 193 of the second light blocking strips 191 located in the overlap region 1901 form a same pattern as center lines 193 of the first light blocking strips 191' located in the mask splicing exposure area 190'. For example, the pattern formed by the center lines 193 of the second light blocking strips 191 located in the overlap region 1901, and the pattern formed by the center lines 193 of the first light blocking strips 191' located in the mask splicing exposure area 190' coincide with each other when superposed.

As shown in FIG. 20, according to some exemplary embodiments of the present disclosure, the mask 19 includes two mask splicing exposure areas 190' respectively constituted by two opposite side edges of the mask 19, the two mask splicing exposure areas 190' include a first mask splicing exposure area 190' and a second mask splicing exposure area 190', the mask normal exposure area 190 is located between the first mask splicing exposure area 190' and the second mask splicing exposure area 190', there is a first boundary line 192 between the first mask splicing exposure area 190' and the mask normal exposure area 190, there is a second boundary line 192 between the second mask splicing exposure area 190' and the mask normal exposure area 190, and the first boundary line 192 and the second boundary line 192 constitute a boundary line 192 between the two mask splicing exposure areas 190' and the mask normal exposure area 190. According to an example of the present disclosure, the mask 19 further includes: a first overlap region 1901 constituted by a part of the mask normal exposure area 190, wherein the first overlap region 1901 adjoins the first mask splicing exposure area 190' and has a same size as the second mask splicing exposure area 190', and center lines 193 of the second light blocking strips 191 located in the first overlap region 1901 form a same pattern as center lines 193 of the first light blocking strips 191' located in the second mask splicing exposure area 190'; and a second overlap region 1901 constituted by another part of the mask normal exposure area 190, wherein the second overlap region 1901 adjoins the second mask splicing exposure area 190' and has a same size as the first mask splicing exposure area 190', and center lines 193 of the second light blocking strips 191 located in the second overlap region 1901 form a same pattern as center lines 193 of the first light blocking strips 191' located in the first mask splicing exposure area 190'. For example, the pattern formed by the center lines 193 of the second light blocking strips 191 located in the first overlap region 1901, and the pattern formed by the center lines 193 of the first light blocking strips 191' located in the second mask splicing exposure area 190' coincide with each other when superposed, and the pattern formed by the center lines 193 of the second light blocking strips 191 located in the second overlap region 1901, and the pattern formed by the center lines 193 of the first light blocking strips 191' located in the first mask splicing exposure area 190' coincide with each other when superposed.

As shown in FIG. 21, according to some exemplary embodiments of the present disclosure, the mask 19 has a rectangular shape and includes four mask splicing exposure areas 190' respectively constituted by four side edges of the mask 19, every two adjacent ones of the four mask splicing exposure areas 190' overlap at a corner of the mask 19, the four mask splicing exposure areas 190' as a whole have a rectangular ring shape, the four mask splicing exposure areas 190' include: a first mask splicing exposure area 190' and a second mask splicing exposure area 190' opposite to each other; and a third mask splicing exposure area 190' and a fourth mask splicing exposure area 190' opposite to each other, the mask normal exposure area 190 is surrounded by the four mask splicing exposure areas 190', and there is a rectangular boundary line 192 between the four mask splicing exposure areas 190' and the mask normal exposure area 190. According to an example of the present disclosure, the mask 19 further includes: a first overlap region 1901 and a second overlap region 1901 opposite to each other; and a third overlap region 1901 and a fourth overlap region 1901 opposite to each other. The first overlap region 1901 adjoins the first mask splicing exposure area 190' and has a same size as the second mask splicing exposure area 190', and center lines 193 of the light blocking strips 191' and 191 located in the first overlap region 1901 and including the first light blocking strips 191' and the second light blocking strips 191 form a same pattern as center lines 193 of the first light blocking strips 191' located in the second mask splicing exposure area 190'. The second overlap region 1901 adjoins the second mask splicing exposure area 190' and has a same size as the first mask splicing exposure area 190', and center lines 193 of the light blocking strips 191' and 191 located in the second overlap region 1901 and including the first light blocking strips 191' and the second light blocking strips 191 form a same pattern as center lines 193 of the first light blocking strips 191' located in the first mask splicing exposure area 190'. The third overlap region 1901 adjoins the third mask splicing exposure area 190' and has a same size as the fourth mask splicing exposure area 190', and center lines 193 of the light blocking strips 191' and 191 located in the third overlap region 1901 and including the first light blocking strips 191' and the second light blocking strips 191 form a same pattern as center lines 193 of the first light blocking strips 191' located in the fourth mask splicing exposure area 190'. Further the fourth overlap region 1901 adjoins the fourth mask splicing exposure area 190' and has a same size as the third mask splicing exposure area 190', and center lines 193 of the light blocking strips 191' and 191 located in the fourth overlap region 1901 and including the first light blocking strips 191' and the second light blocking strips 191 form a same pattern as center lines 193 of the first light blocking strips 191' located in the third mask splicing exposure area 190'. For example, the pattern formed by the center lines 193 of the light blocking strips 191' and 191 located in the first overlap region 1901 and including the first light blocking strips 191' and the second light blocking strips 191, and the pattern formed by the center lines 193 of the first light blocking strips 191' located in the second mask splicing exposure area 190' coincide with each other when superposed, the pattern formed by the center lines 193 of the light blocking strips 191' and 191 located in the second overlap region 1901 and including the first light blocking strips 191' and the second light blocking strips 191, and the pattern formed by the center lines 193 of the first light blocking strips 191' located in the first mask splicing exposure area 190' coincide with each other when superposed, the pattern formed by the center lines 193 of the light blocking strips 191' and 191 located in the third overlap region 1901 and including the first light blocking strips 191' and the second light blocking strips 191, and the pattern formed by the center lines 193 of the first light blocking strips 191' located in the fourth mask splicing exposure area 190' coincide with each other when superposed, and the pattern formed by the center lines 193 of the light blocking strips 191' and 191 located in the fourth overlap region 1901 and including the first light blocking strips 191' and the second light blocking strips 191, and the pattern formed by the center lines 193 of the first light blocking strips 191' located in the third mask splicing exposure area 190' coincide with each other when superposed.

As shown in FIG. 22, according to some exemplary embodiments of the present disclosure, the mask 19 has a rectangular shape and includes two mask splicing exposure areas 190' respectively constituted by two adjacent side edges of the mask 19, the two mask splicing exposure areas 190' overlap at a corner of the mask 19, the two mask splicing exposure areas 190' include a first mask splicing exposure area 190' and a second mask splicing exposure area 190', the two mask splicing exposure areas 190' as a whole have an L shape, and there is an L-shaped boundary line 192 between the two mask splicing exposure areas 190' and the mask normal exposure area 190. According to an example of the present disclosure, the mask 19 further includes: a first overlap region 1901, wherein the first overlap region 1901 and the first mask splicing exposure area 190' are constituted by two opposite side edges of the mask 19, respectively, and have a same size, and center lines 193 of the light blocking strips 191' and 191 located in the first overlap region 1901 and including the first light blocking strips 191' and the second light blocking strips 191 form a same pattern as center lines 193 of the first light blocking strips 191' located in the first mask splicing exposure area 190'; and a second overlap region 1901, wherein the second overlap region 1901 and the second mask splicing exposure area 190' are constituted by two opposite side edges of the mask 19, respectively, and have a same size, and center lines 193 of the light blocking strips 191' and 191 located in the second overlap region 1901 and including the first light blocking strips 191' and the second light blocking strips 191 form a same pattern as center lines 193 of the first light blocking strips 191' located in the second mask splicing exposure area 190'. For example, the pattern formed by the center lines 193 of the light blocking strips 191' and 191 located in the first overlap region 1901 and including the first light blocking strips 191' and the second light blocking strips 191, and the pattern formed by the center lines 193 of the first light blocking strips 191' located in the first mask splicing exposure area 190' coincide with each other when superposed, and the pattern formed by the center lines 193 of the light blocking strips 191' and 191 located in the second overlap region 1901 and including the first light blocking strips 191' and the second light blocking strips 191, and the pattern formed by the center lines 193 of the first light blocking strips 191' located in the second mask splicing exposure area 190' coincide with each other when superposed.

Referring to FIGS. 19 to 22, in embodiments of the present disclosure, the side edge of the mask 19 may be referred to as the mask splicing exposure area 190', and the light blocking strips 191' located in the mask splicing exposure area 190' are the first light blocking strips 191'. The other effective exposure area 190 of the mask 19 is referred to as the mask normal exposure area 190 and the light blocking strips 191 located in the mask normal exposure area 190 are the second light blocking strips 191.

Referring to FIG. 19, FIG. 22 and FIG. 23, in embodiments of the present disclosure, the mask splicing exposure area 190' has a substantially rectangular shape, and there is a boundary line 192 between the mask splicing exposure area 190' and the mask normal exposure area 190. The mask splicing exposure area 190' has a width Ws. For example, the width Ws may be in a range of 6 mm to 10 mm, or in a range of 3 mm to 5 mm.

Referring to FIGS. 20, 21 and 23, in embodiments of the present disclosure, the mask splicing exposure area 190' has a substantially rectangular shape, and there is a boundary line 192 between the mask splicing exposure area 190' and the mask normal exposure area 190. The two or four mask splicing exposure areas 190' have a same width, and each of the two or four mask splicing exposure areas 190' has a width Ws. For example, the width Ws may be in a range of 3 mm to 5 mm. For example, the width Ws may be 3 mm, 3.5 mm, 4 mm, 4.5 mm, or 5 mm.

Referring to FIGS. 19 and 23, in embodiments of the present disclosure, the mask 19 further includes: an overlap region 1901 constituted by a part of the mask normal exposure area 190. The overlap region 1901 and the mask splicing exposure area 190' are constituted by two opposite side edges of the mask 19, respectively. When the splicing exposure process is performed, the overlap region 1901 cooperates with the mask splicing exposure area 190' to form the pattern of the substrate splicing exposure area 21C of the substrate 21 shown in FIG. 28. In other words, in order to form the pattern of the substrate splicing exposure area 21C of the substrate 21, one exposure is performed on the substrate splicing exposure area 21C by means of the overlap region 1901, and one exposure is performed on the substrate splicing exposure area 21C by means of the mask splicing exposure area 190'. A width of the overlap region 1901 may be equal to the width Ws of the mask splicing exposure area 190'. Center lines 193 of the second light blocking strips 191 located in the overlap region 1901 form a same pattern as center lines 193 of the first light blocking strips 191' located in the mask splicing exposure area 190'. The pattern formed by the center lines 193 of the second light blocking strips 191 located in the overlap region 1901, and the pattern formed by the center lines 193 of the first light blocking strips 191' located in the mask splicing exposure area 190' coincide with each other when superposed. Each of the width of the overlap region 1901 and the width of the mask splicing exposure area 190' is equal to the width of the substrate splicing exposure area 21C of the substrate 21.

Referring to FIGS. 20 and 23, in embodiments of the present disclosure, the mask 19 further includes: a first overlap region 1901 constituted by a part of the mask normal exposure area 190; and a second overlap region 1901 constituted by another part of the mask normal exposure area 190. The two overlap regions 1901 adjoin the two mask splicing exposure areas 190', respectively. When the splicing exposure process is performed, referring to FIG. 24, the left overlap region 1901 and the left mask splicing exposure area 190' of the mask 19 cooperates respectively with the right mask splicing exposure area 190' and the right overlap region 1901 of the mask 19 to form the pattern of the substrate splicing exposure area 21C of the substrate 21 shown in FIG. 28. In other words, in order to form the pattern of the substrate splicing exposure area 21C of the substrate 21, one exposure is performed on the substrate splicing exposure area 21C by means of the right mask splicing exposure area 190' and the right overlap region 1901 of the mask 19, and one exposure is performed on the substrate splicing exposure area 21C by means of the left overlap region 1901 and the left mask splicing exposure area 190' of the mask 19. The width of the overlap region 1901 may be equal to the width Ws of the mask splicing exposure area 190'. Center lines 193 of the second light blocking strips 191 located in the left overlap region 1901 of the mask 19 form a same pattern as center lines 193 of the first light blocking strips 191' located in the right mask splicing exposure area 190' of the mask 19, and center lines 193 of the first light blocking strips 191' located in the left mask splicing exposure area 190' of the mask 19 form a same pattern as center lines 193 of the second light blocking strips 191 located in the right overlap region 1901 of the mask 19. The pattern formed by the center lines 193 of the second light blocking strips 191 located in the left overlap region 1901 of the mask 19, and the pattern formed by the center lines 193 of the first light blocking strips 191' located in the right mask splicing exposure area 190' of the mask 19 coincide with each other when superposed, and the pattern formed by the center lines 193 of the first light blocking strips 191' located in the left mask splicing exposure area 190' of the mask 19, and the pattern formed by the center lines 193 of the second light blocking strips 191 located in the right overlap region 1901 of the mask 19 coincide with each other when superposed. A total width of the left overlap region 1901 and the left mask splicing exposure area 190' of the mask 19 is equal to a total width of the right mask splicing exposure area 190' and the right overlap region 1901 of the mask 19, and is equal to the width of the substrate splicing exposure area 21C of the substrate 21.

A manner in which a splicing exposure process is performed by means of the mask 19 shown in FIG. 22 is similar to the manner in which the splicing exposure process is performed by means of the mask 19 shown in FIG. 19, but the splicing exposure process can be performed in two directions perpendicular to each other by means of the mask 19 shown in FIG. 22. In addition, A manner in which a splicing exposure process is performed by means of the mask 19 shown in FIG. 21 is similar to the manner in which the splicing exposure process is performed by means of the mask 19 shown in FIG. 20, but the splicing exposure process can be performed in two directions perpendicular to each other by means of the mask 19 shown in FIG. 21.

Referring to FIGS. 19 to 23, in embodiments of the present disclosure, each of the first light blocking strips 191' in the mask splicing exposure area 190' makes an angle of less than 90 degrees with a side of the mask 19. For example, each of the first light blocking strips 191' in the mask splicing exposure area 190' is inclined. The mask 19 has a rectangular shape, and has four sides. Each of the first light blocking strips 191' in the mask splicing exposure area 190' makes an angle of less than 90 degrees with one of the four sides of the mask 19, or each of the first light blocking strips 191' in the mask splicing exposure area 190' is inclined to one of the four sides of the mask 19. Further, each of the second light blocking strips 191 in the mask normal exposure area 190 makes an angle of less than 90 degrees with the side of the mask 19. For example, each of the second light blocking strips 191 in the mask normal exposure area 190 is inclined. Each of the second light blocking strips 191 in the mask normal exposure area 190 of the mask 19 makes an angle of less than 90 degrees with one of the four sides of the mask 19, or each of the second light blocking strips 191 in the mask normal exposure area 190 is inclined to one of the four sides of the mask 19.

Referring to FIGS. 19 to 23, in embodiments of the present disclosure, a difference between a spacing between two adjacent and parallel ones of the first light blocking strips 191' in the mask splicing exposure area 190' and a spacing between two adjacent and parallel ones of the second light blocking strips 191 in the mask normal exposure area 190 is equal to a difference $2W_p$ between a line width of each of the first light blocking strips 191' and a line width of each of the second light blocking strips 191. A spacing between the center lines 193 of two adjacent and parallel ones of the first light blocking strips 191' is equal to a spacing between the center lines 193 of two adjacent and parallel ones of the second light blocking strips 191.

Referring to FIGS. 19 to 23, in embodiments of the present disclosure, the center lines 193 of the plurality of light blocking strips 191' and 191 including the first light blocking strips 191' and the second light blocking strips 191 include: first center lines 193 extending in the first direction and arranged at equal intervals; and second center lines 193 extending in the second direction and arranged at equal intervals, as shown in FIG. 22, and the first center lines 193 and the second center lines 193 are disposed crosswise in a uniform mesh shape. Referring to FIG. 23, for example, one of the first light blocking strips 191' and one of the second light blocking strips 191, intersecting the boundary line 192 at a same point of intersection 194 and extending in a same one of the first direction and the second direction, have a common center line 193. The first light blocking strip 191' is symmetrical about the common center line 193 in a cross section of the first light blocking strip 191' perpendicular to the common center line 193, and the second light blocking strip 191 is symmetrical about the common center line 193 in a cross section of the second light blocking strip 191 perpendicular to the common center line 193.

Referring to FIGS. 20 and 23, in embodiments of the present disclosure, the center lines 193 of the plurality of light blocking strips 191' and 191 including the first light blocking strips 191' and the second light blocking strips 191 include: first center lines 193 extending in the first direction and arranged at equal intervals; and second center lines 193 extending in the second direction and arranged at equal intervals, as shown in FIG. 23, and the first center lines 193 and the second center lines 193 are disposed crosswise in a uniform mesh shape. Referring to FIGS. 20 and 23, for example, one of the first light blocking strips 191' and one of the second light blocking strips 191, intersecting a same one of the first boundary line 192 and the second boundary line 192 at a same point of intersection 194 and extending in a same one of the first direction and the second direction, have a common center line 193. The first light blocking strip 191' is symmetrical about the common center line 193 in a cross section of the first light blocking strip 191' perpendicular to the common center line 193, and the second light blocking strip 191 is symmetrical about the common center line 193 in a cross section of the second light blocking strip 191 perpendicular to the common center line 193.

Figure 24:
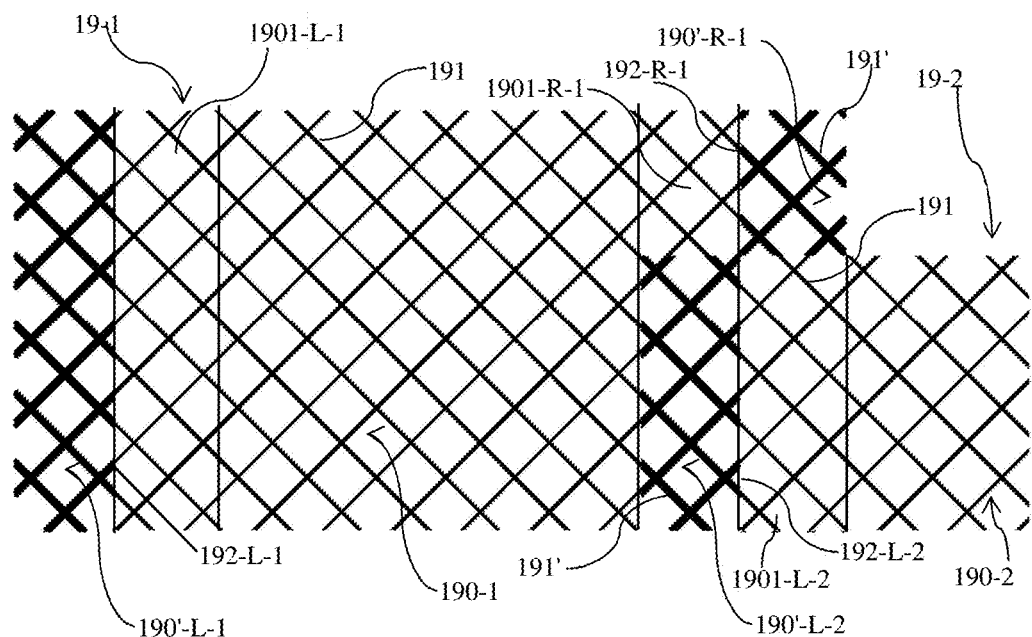
FIG. 24 is a partial top view schematically showing a relation between positions of the mask in two successive exposures when a splicing exposure process is performed by means of the mask shown in FIG. 20.
Figure 25:
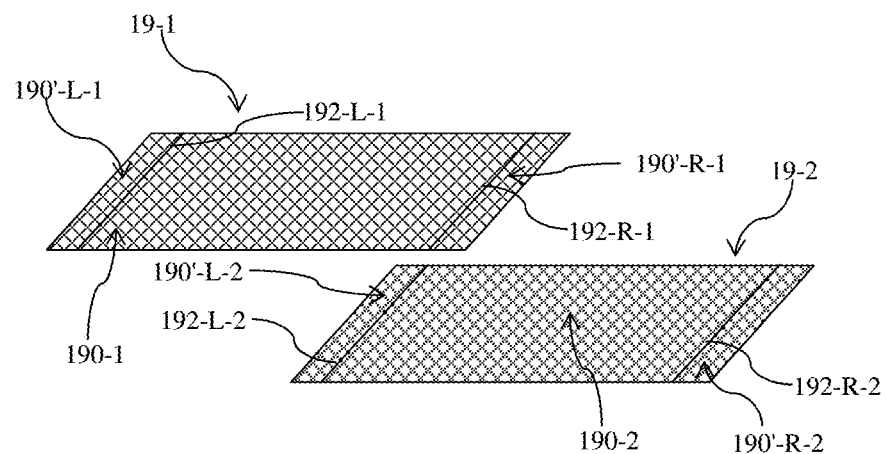
FIG. 25 is a perspective view schematically showing the relation between the positions of the mask in the two successive exposures when the splicing exposure process is performed by means of the mask shown in FIG. 20.
Figure 26:
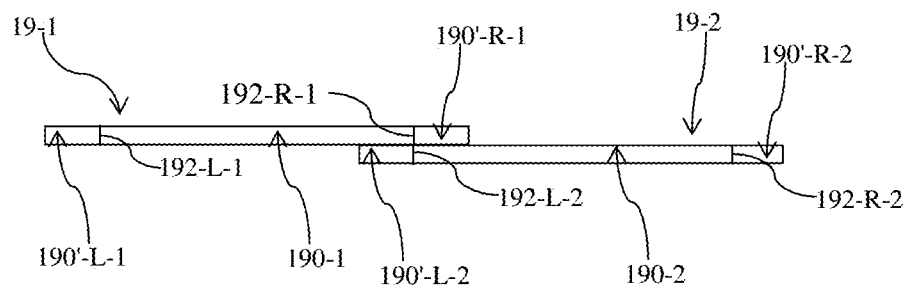
FIG. 26 is a front view schematically showing the relation between the positions of the mask in the two successive exposures when the splicing exposure process is performed by means of the mask shown in FIG. 20.
Figure 27:
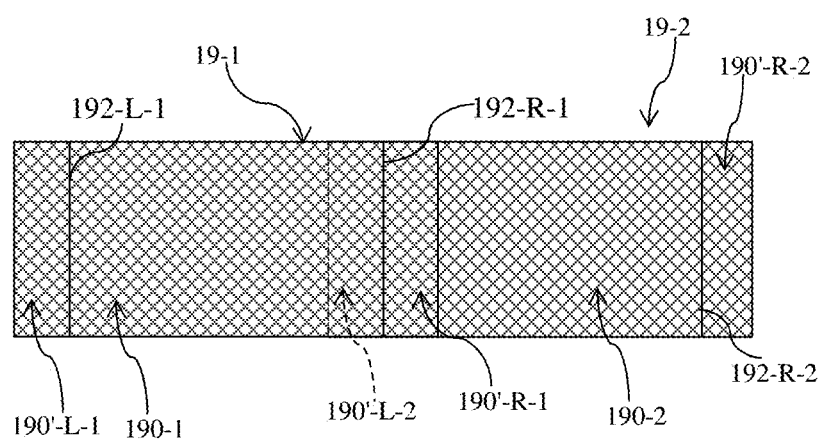
FIG. 27 is a top view schematically showing the relation between the positions of the mask in the two successive exposures when the splicing exposure process is performed by means of the mask shown in FIG. 20.

FIG. 24 is a partial top view schematically showing a relation between positions of the mask 19 in two successive exposures when a splicing exposure process is performed by means of the mask 19 shown in FIG. 20; FIG. 25 is a perspective view schematically showing the relation between the positions of the mask 19 in the two successive exposures when the splicing exposure process is performed by means of the mask 19 shown in FIG. 20; FIG. 26 is a front view schematically showing the relation between the positions of the mask 19 in the two successive exposures when the splicing exposure process is performed by means of the mask 19 shown in FIG. 20; and FIG. 27 is a top view schematically showing the relation between the positions of the mask 19 in the two successive exposures when the splicing exposure process is performed by means of the mask 19 shown in FIG. 20.

In FIGS. 24 to 27, for the sake of clarity, "-L" is added to the reference sign of the left mask splicing exposure area (the first mask splicing exposure area), "-R" is added to the reference sign of the right mask splicing exposure area (the second mask splicing exposure area), "-L" is added to the reference sign of the left boundary line (the first boundary line), "-R" is added to the reference sign of the right boundary line (the second boundary line), "-L" is added to the reference sign of the left overlap region (the first overlap region), and "-R" is added to the reference sign of the right overlap region (the second overlap region); and "-1" is added to the reference signs of the mask 19 and the components of the mask 19 in the first exposure, and "-2" is added to the reference signs of the mask 19 and the components of the mask 19 in the second exposure. It should be noted that the mask shown in FIGS. 24 to 27 is only used to illustrate a relation between positions of the projections formed by the mask by means of an exposure light source in the two successive exposures, rather than a relation between actual positions of the mask. Therefore, the mask shown in FIGS. 24 to 27 can be understood as the projection formed by the mask by means of the exposure light source to a certain extent.

In FIGS. 24 to 27, the left mask 19-1 represents the mask 19-1 positioned in the first exposure in the two successive exposures, and the right mask 19-2 represents the mask 19-2 positioned in the second exposure in the two successive exposures. The mask splicing exposure area 190'-R-1 of the mask 19-1 in the first exposure, and the mask splicing exposure area 190'-L-2 of the mask 19-2 in the second exposure are located in the substrate splicing exposure area 21C of the substrate 21 shown in FIG. 28. FIG. 24 shows only a portion of the mask 19-2 in the second exposure. Referring to FIGS. 20 to 21, the width of the substrate splicing exposure area 21C of the substrate 21 shown in FIG. 28 may be substantially equal to two times as large as the width Ws of the mask splicing exposure area 190' of the mask 19.

Referring to FIGS. 24 to 27, according to embodiments of the present disclosure, in the first exposure process, an exposure is performed on the first region of the substrate by means of the mask 19-1, and in the second exposure process, an exposure is performed on the second region of the substrate by means of the mask 19-2. A complete pattern of the touch sense electrode or the touch drive electrode is formed on the substrate by means of the two exposures. Therefore, a design in which some of the light blocking strips of the mask 19 are widened can compensate for the position deviation between the two exposures so that in a display panel or touch display panel formed finally, the line width of the metal line in the substrate splicing exposure area is equal to the line width of the metal line in the substrate normal exposure area, thereby alleviating or even eliminating the mura phenomenon.

Referring to FIGS. 20, and 24 to 27, in embodiments of the present disclosure, the mask 19 further includes: a first mask splicing exposure area 190'-L, a second mask splicing exposure area 190'-R, and a mask normal exposure area 190. The first mask splicing exposure area 190'-L and the second mask splicing exposure area 190'-R are constituted by two opposite side edges of the mask 19, respectively, and each of the first mask splicing exposure area 190'-L and the second mask splicing exposure area 190'-R has a rectangular shape. The mask normal exposure area 190 is located between the first mask splicing exposure area 190'-L and the second mask splicing exposure area 190'-R. There is a first boundary line 192-L between the first mask splicing exposure area 190'-L and the mask normal exposure area 190, and there is a second boundary line 192-R between the second mask splicing exposure area 190'-R and the mask normal exposure area 190. The first light blocking strips 191' are located in the first mask splicing exposure area 190'-L and the second mask splicing exposure area 190'-R of the mask 19, and the second light blocking strips 191 are located in the mask normal exposure area 190.

Referring to FIGS. 23 and 24, in embodiments of the present disclosure, the mask 19 further includes: a first overlap region 1901-L constituted by a part of the mask normal exposure area 190; and a second overlap region 1901-R constituted by another part of the mask normal exposure area 190. The first overlap region 1901-L adjoins the first mask splicing exposure area 190'-L and has a same size as the second mask splicing exposure area 190'-R, and center lines 193 of the second light blocking strips 191 located in the first overlap region 1901-L form a same pattern as center lines 193 of the first light blocking strips 191' located in the second mask splicing exposure area 190'-R. For example, the pattern formed by the center lines 193 of the second light blocking strips 191 located in the first overlap region 1901-L, and the pattern formed by the center lines 193 of the first light blocking strips 191' located in the second mask splicing exposure area 190'-R coincide with each other when superposed. Furthermore, the second overlap region 1901-R adjoins the second mask splicing exposure area 190'-R and has a same size as the first mask splicing exposure area 190'-L, and center lines 193 of the second light blocking strips 191 located in the second overlap region 1901-R form a same pattern as center lines 193 of the first light blocking strips 191' located in the first mask splicing exposure area 190'-L. For example, the pattern formed by the center lines 193 of the second light blocking strips 191 located in the second overlap region 1901-R, and the pattern formed by the center lines 193 of the first light blocking strips 191' located in the first mask splicing exposure area 190'-L coincide with each other when superposed.

Referring to FIGS. 19 to 27, in embodiments of the present disclosure, a projection, on the substrate, of the first boundary line 192-L-2 of the mask 19-2 in the second exposure coincides with a projection, on the substrate, of the second boundary line 192-R-1 of the mask 19-1 in the first exposure. For example, a projection formed on the substrate by the first boundary line 192-L-2 of the mask 19-2 by means of an exposure light source in the second exposure coincides with a projection formed on the substrate by the second boundary line 192-R-1 of the mask 19-1 by means of the exposure light source in the first exposure. For example, since the mask 19 is translated from a position for the first exposure to a position for the second exposure, the first boundary line 192-L-2 of the mask 19-2 in the second exposure coincides with the second boundary line 192-R-1 of the mask 19-1 in the first exposure.

A projection, on the substrate, of the first light blocking strips 191' in the first mask splicing exposure area 190'-L-2 of the mask 19-2 in the second exposure partially overlaps a part (formed by the second light blocking strips 191 in the second overlap region 1901-R-1 shown in FIG. 24) of a projection, on the substrate, of the second light blocking strips 191 in the mask normal exposure area 190-1 of the mask 19-1 in the first exposure, and the part (formed by the second light blocking strips 191 in the second overlap region 1901-R-1 shown in FIG. 24) of the projection of the second light blocking strips 191 adjoins a projection, on the substrate, of the second boundary line 192-R-1 of the mask 19-1 in the first exposure. For example, a projection formed on the substrate by the first light blocking strips 191', located in the first mask splicing exposure area 190'-L-2 of the mask 19-2, by means of the exposure light source in the second exposure partially overlaps a part (formed by the second light blocking strips 191 in the second overlap region 1901-R-1 shown in FIG. 24) of a projection formed on the substrate by the second light blocking strips 191, located in the mask normal exposure area 190-1 of the mask 19-1, by means of the exposure light source in the first exposure.

A part (formed by the second light blocking strips 191 in the first overlap region 1901-L-2 shown in FIG. 24) of a projection, on the substrate, of the second light blocking strips 191 in the mask normal exposure area 190-2 of the mask 19-2 in the second exposure partially overlaps a projection, on the substrate, of the first light blocking strips 191' in the second mask splicing exposure area 190'-R-1 of the mask 19-1 in the first exposure, and the part (formed by the second light blocking strips 191 in the first overlap region 1901-L-2 shown in FIG. 24) of the projection of the second light blocking strips 191 adjoins a projection, on the substrate, of the first boundary line 192-L-2 of the mask 19-2 in the second exposure. For example, a part (formed by the second light blocking strips 191 in the first overlap region 1901-L-2 shown in FIG. 24) of a projection formed on the substrate by the second light blocking strips 191, located in the mask normal exposure area 190-2 of the mask 19-2, by means of the exposure light source in the second exposure partially overlaps a projection formed on the substrate by the first light blocking strips 191', located in the second mask splicing exposure area 190'-R-1 of the mask 19-1, by means of the exposure light source in the first exposure.

According to the embodiments of the present disclosure, the splicing exposure process including two exposures is used to satisfy a need to produce a large-sized display panel or touch display panel by means of a low-generation production line. For the embodiments of the present disclosure, it is also to be noted that the embodiments of the present disclosure and the features in the embodiments of the present disclosure may be combined with one another to obtain new embodiments unless they conflict.

While the first light blocking strips in the side edge of the mask is shown in FIGS. 6, 8, and 11A to 14, they may be replaced with the first light blocking strips 191' arranged in a mesh shape in the mask splicing exposure area 190' (i.e. the side edge) of the mask 19 shown in FIGS. 19 to 27.

Further, the mask splicing exposure areas 190' may have a same width or different widths, the overlap regions 1901 may have a same width or different widths, and the mask splicing exposure areas 190' and the overlap regions 1901 may have a same width.

According to the embodiments of the present disclosure, the splicing exposure process including two exposures is used to satisfy a need to produce a large-sized display panel or touch display panel by means of a low-generation production line. For the embodiments of the present disclosure, it is also to be noted that the embodiments of the present disclosure and the features in the embodiments of the present disclosure may be combined with one another to obtain new embodiments unless they conflict.

Although some exemplary embodiments of the present disclosure have been shown above, it would be appreciated by a person skilled in the art that modifications may be made therein without departing from the principle and spirit of the present disclosure, the scope of which is defined in the appended claims and their equivalents.

What is claimed is:

1. A mask comprising:
a mask normal exposure area;
a mask splicing exposure area constituted by a side edge of the mask and adjoining the mask normal exposure area; and
a plurality of light blocking strips configured to block light and bounding spaces, wherein the spaces are configured such that light is allowed to pass through the spaces,
wherein the plurality of light blocking strips are arranged in a mesh shape, the plurality of light blocking strips comprise first light blocking strips located in the mask splicing exposure area of the mask, and second light blocking strips located in the mask normal exposure area, and each of the first light blocking strips has a greater width than each of the second light blocking strips; and
wherein the mask is configured to be used in a splicing exposure process comprising at least two exposures, each of the first light blocking strips has a first width, each of the second light blocking strips has a second width, and a difference between the first width and the second width is in direct proportion to a position deviation of the mask between the two exposures in the splicing exposure process.

2. An exposure method, comprising:
providing the mask of claim 1;
providing a substrate comprising a first exposure region and a second exposure region;
aligning the mask with the first exposure region of the substrate to perform a first exposure;
moving the mask relative to the substrate; and
aligning the mask with the second exposure region of the substrate to perform a second exposure.

3. The exposure method of claim 2, wherein:
aligning the mask with the first exposure region of the substrate to perform the first exposure comprises:
forming a first pattern in the first exposure region by means of the first light blocking strips of the mask; and
forming a second pattern in the first exposure region by means of the second light blocking strips of the mask,
wherein the first pattern has a greater line width than the second pattern.

4. A touch display panel comprising:
a substrate;
a touch drive electrode disposed on the substrate; and
a touch sense electrode disposed on the substrate,
wherein at least one of the touch drive electrode or the touch sense electrode has a metal mesh structure, and is manufactured by the exposure method of claim 2.

5. The mask of claim 1, wherein:
there is a boundary line between the mask splicing exposure area and the mask normal exposure area, the first light blocking strips of the plurality of light blocking strips are disposed crosswise in a mesh shape, and the second light blocking strips of the plurality of light blocking strips are disposed crosswise in a mesh shape.

6. The mask of claim 5, wherein:
each of the first light blocking strips in the mask splicing exposure area makes an angle of less than 90 degrees with a side of the mask.

7. The mask of claim 5, wherein:
a difference between a spacing between two adjacent and parallel ones of the first light blocking strips in the mask splicing exposure area and a spacing between two adjacent and parallel ones of the second light blocking strips in the mask normal exposure area is equal to a difference between a line width of each of the first light blocking strips and a line width of each of the second light blocking strips.

8. The mask of claim 5, further comprising:
an overlap region, wherein at least a portion of the overlap region is constituted by a part of the mask normal exposure area, the overlap region has a same size as the mask splicing exposure area, and center lines of the light blocking strips located in the overlap region and comprising the second light blocking strips or comprising the first light blocking strips and the second light blocking strips form a same pattern as center lines of the first light blocking strips located in the mask splicing exposure area.

9. The mask of claim 5, further comprising:
an overlap region constituted by a part of the mask normal exposure area, wherein the overlap region and the mask splicing exposure area are constituted by two opposite side edges of the mask, respectively, and have a same size, and center lines of the second light blocking strips located in the overlap region form a same pattern as center lines of the first light blocking strips located in the mask splicing exposure area.

10. The mask of claim 5, wherein:
the mask comprises two mask splicing exposure areas respectively constituted by two opposite side edges of the mask, the two mask splicing exposure areas comprise a first mask splicing exposure area and a second mask splicing exposure area, the mask normal exposure area is located between the first mask splicing exposure area and the second mask splicing exposure area, there is a first boundary line between the first mask splicing exposure area and the mask normal exposure area, there is a second boundary line between the second mask splicing exposure area and the mask normal exposure area, and the first boundary line and the second boundary line constitute a boundary line between the two mask splicing exposure areas and the mask normal exposure area.

11. The mask of claim 10, further comprising:
a first overlap region constituted by a part of the mask normal exposure area, wherein the first overlap region adjoins the first mask splicing exposure area and has a same size as the second mask splicing exposure area, and center lines of the second light blocking strips located in the first overlap region form a same pattern as center lines of the first light blocking strips located in the second mask splicing exposure area; and
a second overlap region constituted by another part of the mask normal exposure area, wherein the second overlap region adjoins the second mask splicing exposure area and has a same size as the first mask splicing exposure area, and center lines of the second light blocking strips located in the second overlap region form a same pattern as center lines of the first light blocking strips located in the first mask splicing exposure area.

12. The mask of claim 5, wherein:
the mask has a rectangular shape and comprises four mask splicing exposure areas respectively constituted by four side edges of the mask, every two adjacent ones of the four mask splicing exposure areas overlap at a corner of the mask, the four mask splicing exposure areas as a whole have a rectangular ring shape, the four mask splicing exposure areas comprise: a first mask splicing exposure area and a second mask splicing exposure area opposite to each other; and a third mask splicing exposure area and a fourth mask splicing exposure area opposite to each other, the mask normal exposure area is surrounded by the four mask splicing exposure areas, and there is a rectangular boundary line between the four mask splicing exposure areas and the mask normal exposure area.

13. The mask of claim 12, further comprising:
a first overlap region and a second overlap region opposite to each other; and
a third overlap region and a fourth overlap region opposite to each other, wherein:
the first overlap region adjoins the first mask splicing exposure area and has a same size as the second mask splicing exposure area, and center lines of the light blocking strips located in the first overlap region and comprising the first light blocking strips and the second light blocking strips form a same pattern as center lines of the first light blocking strips located in the second mask splicing exposure area,
the second overlap region adjoins the second mask splicing exposure area and has a same size as the first mask splicing exposure area, and center lines of the light blocking strips located in the second overlap region and comprising the first light blocking strips and the second light blocking strips form a same pattern as center lines of the first light blocking strips located in the first mask splicing exposure area,
the third overlap region adjoins the third mask splicing exposure area and has a same size as the fourth mask splicing exposure area, and center lines of the light blocking strips located in the third overlap region and comprising the first light blocking strips and the second light blocking strips form a same pattern as center lines of the first light blocking strips located in the fourth mask splicing exposure area, and
the fourth overlap region adjoins the fourth mask splicing exposure area and has a same size as the third mask splicing exposure area, and center lines of the light blocking strips located in the fourth overlap region and comprising the first light blocking strips and the second light blocking strips form a same pattern as center lines of the first light blocking strips located in the third mask splicing exposure area.

14. The mask of claim 5, wherein:
the mask has a rectangular shape and comprises two mask splicing exposure areas respectively constituted by two adjacent side edges of the mask, the two mask splicing exposure areas overlap at a corner of the mask, the two mask splicing exposure areas comprise a first mask splicing exposure area and a second mask splicing exposure area, the two mask splicing exposure areas as a whole have an L shape, and there is an L-shaped boundary line between the two mask splicing exposure areas and the mask normal exposure area.

15. The mask of claim 14, further comprising:
a first overlap region, wherein the first overlap region and the first mask splicing exposure area are constituted by two opposite side edges of the mask, respectively, and have a same size, and center lines of the light blocking strips located in the first overlap region and comprising the first light blocking strips and the second light blocking strips form a same pattern as center lines of the first light blocking strips located in the first mask splicing exposure area; and
a second overlap region, wherein the second overlap region and the second mask splicing exposure area are constituted by two opposite side edges of the mask, respectively, and have a same size, and center lines of the light blocking strips located in the second overlap region and comprising the first light blocking strips and the second light blocking strips form a same pattern as center lines of the first light blocking strips located in the second mask splicing exposure area.

16. The mask of claim 5, wherein:
the first light blocking strips comprise: first light blocking strips extending in a first direction; and first light blocking strips extending in a second direction, and the second light blocking strips comprise: second light blocking strips extending in the first direction; and second light blocking strips extending in the second direction, and
center lines of the plurality of light blocking strips comprising the first light blocking strips and the second light blocking strips comprise: first center lines extending in the first direction; and second center lines extending in the second direction, and the first center lines and the second center lines are disposed crosswise in a uniform mesh shape.

17. The mask of claim 16, wherein:
one of the first light blocking strips and one of the second light blocking strips, intersecting the boundary line at a same point of intersection and extending in a same one of the first direction and the second direction, have a common center line.

18. The mask of claim 1, wherein:
each of the mask, the mask splicing exposure area, and the mask normal exposure area has a rectangular shape.

19. The exposure method of claim 3, wherein:
the mask further comprises:
a first mask splicing exposure area and a second mask splicing exposure area respectively constituted by two opposite side edges of the mask and each having a rectangular shape; and
a mask normal exposure area between the first mask splicing exposure area and the second mask splicing exposure area, wherein there is a first boundary line between the first mask splicing exposure area and the mask normal exposure area, there is a second boundary line between the second mask splicing exposure area and the mask normal exposure area, the first light blocking strips are located in the first mask splicing exposure area and the second mask splicing exposure area of the mask, and the second light blocking strips are located in the mask normal exposure area, a projection, on the substrate, of the first boundary line of the mask in the second exposure coincides with a projection, on the substrate, of the second boundary line of the mask in the first exposure, a projection, on the substrate, of the first light blocking strips in the first mask splicing exposure area of the mask in the second exposure partially overlaps a part of a projection, on the substrate, of the second light blocking strips in the mask normal exposure area of the mask in the first exposure, and the part of the projection of the second light blocking strips adjoins a projection, on the substrate, of the second boundary line of the mask in the first exposure, and a part of a projection, on the substrate, of the second light blocking strips in the mask normal exposure area of the mask in the second exposure partially overlaps a projection, on the substrate, of the first light blocking strips in the second mask splicing exposure area of the mask in the first exposure, and the part of the projection of the second light blocking strips adjoins a projection, on the substrate, of the first boundary line of the mask in the second exposure.

* * * * *